United States Patent
Yamamoto

(10) Patent No.: US 9,312,809 B2
(45) Date of Patent: Apr. 12, 2016

(54) OSCILLATION CIRCUIT, OSCILLATOR, ELECTRONIC DEVICE, MOVING OBJECT, AND MANUFACTURING METHOD OF OSCILLATOR

(71) Applicant: Seiko Epson Corporation, Tokyo (JP)

(72) Inventor: Takehiro Yamamoto, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/576,634

(22) Filed: Dec. 19, 2014

(65) Prior Publication Data
US 2015/0180410 A1    Jun. 25, 2015

(30) Foreign Application Priority Data

Dec. 25, 2013  (JP) .................... 2013-267812

(51) Int. Cl.
H03B 5/04    (2006.01)
H03B 5/36    (2006.01)

(52) U.S. Cl.
CPC .............. *H03B 5/04* (2013.01); *H03B 5/364* (2013.01); *H03B 5/366* (2013.01); *Y10T 29/49117* (2015.01)

(58) Field of Classification Search
CPC ............ H03B 5/04; H03B 5/36; H03B 5/366
USPC ........ 331/70, 116 R, 154, 158, 176, 185, 186
See application file for complete search history.

(56) References Cited

U.S. PATENT DOCUMENTS

| | | | |
|---|---|---|---|
| 6,329,860 B1* | 12/2001 | Komatsu | 327/291 |
| 7,880,553 B2 | 2/2011 | Kikuchi et al. | |
| 2006/0132254 A1* | 6/2006 | Routama et al. | 331/176 |
| 2007/0273453 A1* | 11/2007 | Maher | 331/176 |
| 2011/0234328 A1* | 9/2011 | Matsuoka et al. | 331/155 |

FOREIGN PATENT DOCUMENTS

| | | |
|---|---|---|
| JP | 2009-225123 A | 10/2009 |
| JP | 2013-162358 A | 8/2013 |

* cited by examiner

*Primary Examiner* — Jeffrey Shin
(74) *Attorney, Agent, or Firm* — Harness, Dickey & Pierce, P.L.C.

(57) ABSTRACT

An oscillator circuit includes a circuit for oscillation, a temperature compensated circuit, an output circuit, and an amplitude control circuit. The output circuit outputs an oscillation signal as a signal output from the circuit for oscillation is input. The amplitude control circuit includes an amplitude control portion which controls amplitude of the oscillation signal output by the output circuit, and a heat generation portion into which a DC current is input and which generates heat. The heat generation portion controls the input DC current based on operation states of the circuit for oscillation and the amplitude control portion.

14 Claims, 25 Drawing Sheets

| Decimal Notation | VOUT_ADJ<1> | VOUT_ADJ<0> | Vdac(V) | Vclip(V) |
|---|---|---|---|---|
| 0 | 0 | 0 | 0.67 | 0.8 |
| 1 | 0 | 1 | 0.75 | 0.9 |
| 2 | 1 | 0 | 0.83 | 1.0 |
| 3 | 1 | 1 | 0.91 | 1.1 |

FIG. 5

| DIV | IOSC_ADJ<3> | IOSC_ADJ<2> | MOS Which Is On | Total Of Resistance Value |
|---|---|---|---|---|
| 0 | 0 | 0 | M2 | R1+R2 |
| 0 | 0 | 1 | M1 | R1 |
| 0 | 1 | 0 | M4 | R1+R2+R3+R4+R5 |
| 0 | 1 | 1 | M3A | R1+R2+R3 |
| 1 | 0 | 0 | M3B | R1+R2+R3+R4 |
| 1 | 0 | 1 | M3A | R1+R2+R3 |
| 1 | 1 | 0 | M6 | R1+R2+R3+R4+R5+R6+R7 |
| 1 | 1 | 1 | M5 | R1+R2+R3+R4+R5+R6 |

FIG. 15

OSCILLATION CIRCUIT, OSCILLATOR, ELECTRONIC DEVICE, MOVING OBJECT, AND MANUFACTURING METHOD OF OSCILLATOR

BACKGROUND

1. Technical Field

The present invention relates to an oscillation circuit, an oscillator, an electronic device, a moving object, and a manufacturing method of the oscillator. For example, the invention relates to an oscillation circuit provided with a temperature compensated circuit which compensates for frequency fluctuation according to a change in an ambient temperature.

2. Related Art

An AT cut quartz crystal resonator which constitutes a temperature compensated quartz crystal oscillator (TCXO) draws a curve which is approximated with a three-dimensional curved line having a point around 25° C. as an inflection point according to a change in an ambient temperature, and thus a frequency fluctuates. In the TCXO, a voltage signal which compensates frequency fluctuation is generated by a temperature compensated circuit, and is applied to a varicap diode provided in an oscillation circuit. According to this, the frequency fluctuation due to a change in an ambient temperature is suppressed, for example, high frequency accuracy which is ±0.5 ppm in a temperature range of −40° C. to 85° C., is realized. Since three-dimensional temperature characteristics change by variations between each solid of quartz crystal resonator, a voltage output by the temperature compensated circuit is delivered after being adjusted so that the most appropriate temperature compensated voltage is individually obtained in the TCXO. In recent years, a size of the TCXO has been reduced, and there is a case where a test terminal which monitors and inspects the voltage from the temperature compensated circuit and a functional terminal (for example, an output terminal) of an oscillator are used together. For example, when testing the temperature compensated circuit in a case where the test terminal and the functional terminal are used together, an output circuit is in an OFF state and the temperature compensated voltage is monitored by the output terminal. The output circuit is in an OFF state when monitoring the voltage, and the output circuit is in an ON state when normally operating and an oscillation signal is output to the output terminal. For this reason, since the operation of the output terminal when testing the temperature compensated circuit and the operation of the output terminal when normally operating are different from each other, a self heat generation amount of the oscillator itself changes and a temperature in the oscillator changes. As a result, in a case where a circuit, such as the oscillation circuit, in the oscillator shows a change in characteristics due to a temperature change, even when the temperature compensated circuit is tested and the frequency of the oscillation signal is adjusted, there is a problem in that the oscillation signal when normally operating is deviated due to the temperature change in the oscillator, and the frequency cannot be temperature-compensated with high accuracy.

In order to solve the problem, in JP-A-2013-162358, an oscillator provided with a heat generation circuit in which a signal is input from the oscillation circuit when the output circuit is in an OFF state and heat is generated, and which stops the operation thereof when the output circuit is in an ON state, is suggested.

According to the oscillator described in JP-A-2013-162358, since the heat generation circuit which generates the heat when the output circuit is in an OFF state is provided, for example, it is possible to match the heat generation amount when adjusting the temperature compensated circuit and the heat generation amount when the oscillation circuit operates, and to perform an adjustment of the temperature compensated circuit in a similar state to a state of an actual operation. However, a dedicated circuit for generating the heat, for example, a circuit which is equivalent to the output circuit (buffer circuit or the like) is required, and the heat generation circuit generates the heat using the signal of the oscillation circuit as an energy source. For this reason, there is a possibility that an AC signal which is generated from the heat generation circuit when adjusting the temperature compensated circuit has an effect such as noise.

SUMMARY

An advantage of some aspects of the invention is to provide an oscillation circuit, an oscillator, an electronic device, a moving object, and a manufacturing method of the oscillator in which a possibility that a signal generated from a heat generation portion when adjusting a property adjustment circuit has an effect such as noise is reduced while suppressing an increase in a circuit scale.

The invention can be implemented as the following forms or application examples.

Application Example 1

An oscillation circuit according to this application example includes: a circuit for oscillation; a property adjustment circuit; an output circuit into which a signal output from the circuit for oscillation is input and which outputs an oscillation signal; and an amplitude control circuit including an amplitude control portion which controls amplitude of the oscillation signal and a heat generation portion into which a DC current is input and which generates heat. In the heat generation portion, based on operation states of the circuit for oscillation and the amplitude control portion, the DC current is controlled and a heat generation amount is controlled.

For example, the property adjusting circuit may be a temperature compensated circuit, a frequency adjustment circuit, or an auto frequency control (AFC) circuit.

For example, the circuit for oscillation may be a part of various types of oscillation circuits, such as a pierce oscillation circuit, an inverter type oscillation circuit, a Colpitts oscillation circuit, or a Hartley oscillation circuit.

In the oscillation circuit according to this application example, since the heat generation portion generates heat as the input DC current is controlled based on the operation states of the circuit for oscillation and the amplitude control portion, it is not required that the heat generation portion have an AC signal which is output by the output circuit as an energy source, and it is possible to reduce a possibility that the signal generated from the heat generation portion when adjusting the property adjustment circuit has an effect such as noise.

In addition, in the oscillation circuit according to this application example, as the heat generation portion is provided in the amplitude control circuit, since a circuit which is equivalent to the output circuit as the heat generation portion is not required to be newly provided, it is possible to suppress an increase in a circuit scale.

Application Example 2

In the oscillation circuit according to the application example described above, a first terminal which is electrically connected to an output side of the output circuit and a switching portion which switches the electric connection between the property adjustment circuit and the first terminal may be provided. In a first mode, the switching portion may be controlled so that the property adjustment circuit and the first terminal are not electrically connected to each other, the oscillation signal output from the output circuit may be output to the first terminal, and the DC current which is input into the heat generation portion may be stopped. In a second mode, the switching portion may be controlled so that the property adjustment circuit and the first terminal are electrically connected to each other, the oscillation signal may stop being output from the output circuit, and the heat generation portion may control the DC current based on the operation states of the circuit for oscillation and the amplitude control portion.

In the oscillation circuit according to this application example, in the second mode, since it is possible to obtain the signal of the property adjustment circuit from the first terminal, it is possible to perform adjustment of the property adjustment circuit. When adjusting the property adjustment circuit in the second mode, since the heat generation portion generates the heat as the DC current input based on the operation states of the circuit for oscillation and the oscillation control portion is controlled, it is not required that the heat generation portion have the AC signal which is output by the output circuit as the energy source in the first mode, and it is possible to reduce a possibility that the signal generated from the heat generation portion when adjusting the property adjustment circuit has an effect such as noise. In addition, in the second mode, it is possible to maintain a heat generation state which is equivalent to the first mode, and for example, to reduce a frequency temperature compensation error.

Application Example 3

In the oscillation circuit according to the application example described above, the amplitude control circuit may include a level correction circuit for controlling a size of a signal which controls amplitude of the oscillation signal based on the operation state of the oscillation control portion.

In the oscillation circuit according to this application example, when the output frequency is low and when the output frequency is high, as the level correction circuit appropriately controls the size of the signal which controls the amplitude of the oscillation signal, across a wide range of frequencies, it is possible to reliably maintain an output oscillation level.

Application Example 4

In the oscillation circuit according to the application example described above, a memory may be included which stores data for controlling the circuit for oscillation and data for controlling the amplitude control circuit.

In the oscillation circuit according to this application example, for example, it is possible to interlock the data which is stored in the memory with a current input into the heat generation portion.

Application Example 5

In the oscillation circuit according to the application example described above, the property adjustment circuit may be a temperature compensated circuit.

In the oscillation circuit according to this application example, since it is possible to reduce a possibility that an AC signal generated from the heat generation portion when adjusting the property adjustment circuit has an effect such as noise, the frequency temperature compensation error when normally operating can be small, and the frequency temperature compensation is possible with high accuracy. In addition, it is possible to maintain the heat generation state which is equivalent to a normal state when adjusting the temperature compensated circuit, and to reduce the frequency temperature compensation error.

Application Example 6

In the oscillation circuit according to the application example described above, the output circuit may include a frequency dividing circuit.

In the oscillation circuit according to this application example, for example, according to whether or not a frequency-divided signal is output by the frequency dividing circuit when the output circuit is normally operated, it is possible to control the size of the current which is input into the heat generation portion when adjusting the property adjustment circuit.

Application Example 7

An oscillator according to this application example includes any of the oscillation circuits according to the application examples described above, and a resonator.

In this application example, since the heat generation portion generates the heat as the DC current input based on the operation states of the circuit for oscillation and the oscillation control portion is controlled, it is not required that the heat generation portion have the AC signal which is output by the output circuit as the energy source, and it is possible to reduce a possibility that the signal generated from the heat generation portion when adjusting the property adjustment circuit has an effect such as noise.

In addition, in this application example, as the heat generation portion is provided in the amplitude control circuit, since a circuit which is equivalent to the output circuit as the heat generation portion is not required to be newly provided, it is possible to suppress an increase in a circuit scale of the oscillation circuit, and to realize a small-sized oscillator.

Application Example 8

An electronic device according to this application example includes any of the oscillation circuits according to the application examples described above.

Application Example 9

A moving object according to this application example includes any of the oscillation circuits according to the application examples described above.

In these application examples, since the oscillation circuit which can reduce a possibility that the signal generated from the heat generation portion when adjusting the property adjustment circuit has an effect such as noise is used, it is possible to realize an electronic device and a moving object having high reliability.

Application Example 10

A manufacturing method of an oscillator according to this application example includes: electrically connecting an oscillation circuit including a circuit for oscillation, a property adjustment circuit, an output circuit into which a signal output from the circuit for oscillation is input and which outputs an oscillation signal, an amplitude control circuit including an amplitude control portion which controls amplitude of the oscillation signal and a heat generation portion into which a DC current is input and controlled and which controls a heat generation amount, based on operation states of the circuit for oscillation and the oscillation control portion, a first terminal which is electrically connected to an output side of the output circuit, and a switching portion which switches the electrical connection between the property adjustment circuit and the first terminal, and a resonator; switching the switching portion so that the property adjustment circuit and the first terminal are electrically connected to each other, stopping the output of the oscillation signal from the output circuit, and inputting the DC current based on operations of the circuit for oscillation and the amplitude control portion to the heat generation portion; adjusting the property adjustment circuit; and switching the switching portion so that the property adjustment circuit and the first terminal are not electrically connected to each other, outputting the oscillation signal from the output circuit, and preventing the DC current from flowing to the heat generation portion.

In the manufacturing method of an oscillator according to this application example, in the adjusting of the property adjustment circuit, since the heat generation portion generates the heat as the DC current input based on the operation states of the circuit for oscillation and the amplitude control portion is controlled, it is not required that the heat generation portion have the AC signal which is output by the output circuit as the energy source, and it is possible to reduce a possibility that the signal generated from the heat generation portion has an effect such as noise.

In addition, in the manufacturing method of an oscillator according to this application example, as the heat generation portion is provided in the amplitude control circuit, since a circuit which is equivalent to the output circuit as the heat generation portion is not required to be newly provided, it is possible to suppress an increase in a circuit scale of the oscillation circuit, and to manufacture a small-sized oscillator. In addition, in the adjusting of the property adjustment circuit, it is possible to maintain the heat generation state which is equivalent to a normal operational state, and to reduce the frequency temperature compensation error.

BRIEF DESCRIPTION OF THE DRAWINGS

The invention will be described with reference to the accompanying drawings, wherein like numbers reference like elements.

FIG. 5 is a view illustrating an example of a relationship between a set value of an output level adjustment register, an output voltage of a D/A converter, and a clip voltage.

FIG. 15 is a view illustrating a truth table of the decoding circuit.

DESCRIPTION OF EXEMPLARY EMBODIMENTS

Hereinafter, appropriate embodiments of the invention will be described in detail with reference to the drawings. In addition, embodiments described below do not inappropriately limit the contents described in the range of embodiments. In addition, all of the configurations which will be described hereinafter are not limited as necessary configuration conditions of the invention.

1. Oscillator

1-1. First Embodiment

Figure 1:
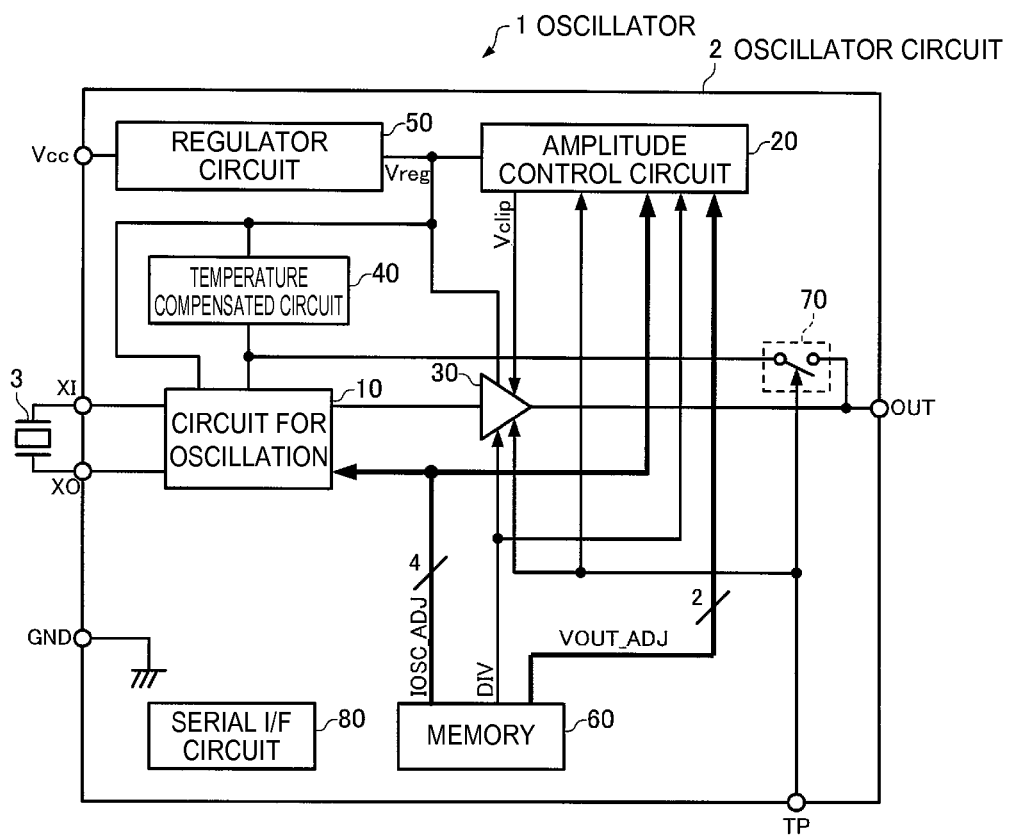
FIG. 1 is a configuration view of an oscillator according to a first embodiment.

FIG. 1 is a configuration view of an oscillator according to a first embodiment. As illustrating in FIG. 1, an oscillator 1 according to the first embodiment is a temperature compensated oscillator including an oscillator circuit 2 and a resonator 3, and the oscillator circuit 2 and the resonator 3 are accommodated in a package (not illustrated).

In the embodiment, the resonator 3 is a quartz crystal resonator which uses a quartz crystal as a basic material. For example, an AT cut quartz crystal resonator or an SC cut quartz crystal resonator, or a tuning fork type quartz crystal resonator is used. The resonator 3 may be a surface acoustic wave (SAW) resonator or a micro electro mechanical systems (MEMS) resonator. In addition, as the basic material of the resonator 3, it is possible to use a piezoelectric single crystal, such as lithium tantalite or lithium niobate, a piezoelectric material, such as piezoelectric ceramics including lead zirconate titanate or the like, or silicon semiconductor material, in addition to the quartz crystal. As excitation means of the resonator 3, means using a piezoelectric effect may be used, or electrostatic driving by a Coulomb force may be used.

The oscillator circuit 2 is provided with a Vcc terminal which is a power supply terminal, a GND terminal which is a grounding terminal, an OUT terminal which is an output terminal, a TP terminal which is a test terminal, and an XI terminal and an XO terminal which are connection terminals connected with the resonator 3. The Vcc terminal, the GND terminal, the OUT terminal, and the TP terminal are connected even to an outer terminal (not illustrated) of the oscillator 1.

In the embodiment, the oscillator circuit 2 includes a circuit for oscillation 10, an amplitude control circuit 20, an output circuit 30, a temperature compensated circuit 40 (one example of a "property adjustment circuit"), a regulator circuit 50, a memory 60, a switch circuit 70 (one example of a "switching portion"), and a serial interface (I/F) circuit 80. In addition, the oscillator circuit 2 of the embodiment may omit or change a part of these components, or may add another component.

The circuit for oscillation 10 is a circuit for oscillating the resonator 3, amplifies an output signal of the resonator 3, and sends feedback of the output signal to the resonator 3. The circuit for oscillation 10 outputs an oscillation signal based on an oscillation of the resonator 3.

The temperature compensated circuit 40 generates a temperature compensated voltage according to frequency temperature characteristics of the resonator 3 having the temperature as a variable, so that an oscillation frequency of the circuit for oscillation 10 is constant regardless of the temperature. The temperature compensated voltage is applied to one end of a variable capacitance element (not illustrated) which functions as a load capacity of the circuit for oscillation 10, and the oscillation frequency is controlled.

The oscillation signal is input from the circuit for oscillation 10 into the output circuit 30, and the output circuit 30 generates and outputs the oscillation signal for an external output.

The amplitude control circuit 20 is a circuit for controlling the amplitude of the oscillation signal which is output by the output circuit 30. The amplitude control circuit has an amplitude control portion which controls the amplitude of the oscillation signal output by the output circuit 30 and a heat generation portion. As will be described later, based on the operation states of the circuit for oscillation 10 and the amplitude control portion of the amplitude control circuit 20, an input DC current is controlled.

The regulator circuit 50 generates constant voltage Vreg which is a power supply voltage or a reference voltage of the circuit for oscillation 10, the temperature compensated circuit 40, and the output circuit 30, based on the power supply voltage supplied from the Vcc terminal.

The memory 60 has a non-volatile memory and a register (not illustrated), and can read and write with respect to the non-volatile memory or the register via the serial interface circuit 80, from the outer terminal. In the embodiment, there are only four terminals, including the Vcc, the GND, the OUT, and the TP, of the oscillator circuit 2 which are connected with the outer terminal of the oscillator 1. For this reason, when the voltage of the Vcc terminal is higher than a threshold value, the serial interface circuit 80 may receive a clock signal SCLK which is externally input from the TP terminal and a data signal DATA which is externally input from the OUT terminal, and may perform reading and writing of data with respect to the non-volatile memory or an internal register (not illustrated).

The switch circuit 70 is a circuit for switching the electric connection between the temperature compensated circuit 40 and the OUT terminal (one example of a first terminal) which is electrically connected to an output side of the output circuit 30.

In the embodiment, when the signal which is input into the TP terminal is at a low level (one example of a first mode), the switch circuit 70 is controlled so that the temperature compensated circuit 40 and the OUT terminal are not electrically connected to each other, and the oscillation signal which is output from the output circuit 30 is output to the OUT terminal. In addition, as will be described later, when the signal which is input into the TP terminal is at a low level, an operation of the heat generation portion of the amplitude control circuit 20 is stopped.

Meanwhile, when the signal which is input into the TP terminal is at a high level (one example of a second mode), the switch circuit 70 is controlled so that the temperature compensated circuit 40 and the OUT terminal are electrically connected to each other, and the output of the oscillation signal from the output circuit 30 is stopped, and the output signal (temperature compensated voltage) of the temperature compensated circuit 40 is output to the OUT terminal. In addition, as will be described later, when the signal which is input into the TP terminal is at a high level, the heat generation portion of the amplitude control circuit 20 controls the input DC current based on the operation states of the circuit for oscillation 10 and the amplitude control portion of the amplitude control circuit 20.

In a case of the TCXO for a GPS used in a cellular phone, a high frequency temperature compensated accuracy which is ±0.5 ppm, for example, is required. Here, in this embodiment, an output voltage amplitude of the output circuit 30 is stabilized by the regulator circuit 50, and in the viewpoint of lowering a consumption current, the output circuit 30 outputs a clipped sine wave form in which the output amplitude is suppressed. In the embodiment, it is possible to adjust the output amplitude of the output circuit 30 to be in a range of 0.8 Vpp to 1.2 Vpp, for example, by the amplitude control circuit 20, and further, a configuration in which a heat generation circuit which is smaller in size than that in the related art is embedded is employed in the amplitude control circuit 20. In addition, in the embodiment, in the memory 60, an oscillation step current adjustment register IOSC_ADJ (data for controlling the circuit for oscillation 10) for adjusting and selecting an oscillation step current of the circuit for oscillation 10 according to the frequency of the resonator 3, a frequency dividing switching register DIV (data for controlling the output circuit 30) for selecting whether or not the oscillation signal is frequency-divided and output by a frequency dividing circuit provided on the inside of the output circuit 30, an output level adjustment register VOUT_ADJ (data for controlling the amplitude control circuit 20) for adjusting the amplitude level of the oscillation signal of the clipped sine wave which is output by the output circuit 30, are provided. By interlocking a setting state based on the data accommodated in these registers, a current amount which flows to the heat generation circuit on the inside of the amplitude control circuit 20 is controlled.

In addition, for example, a set value of these registers is stored in the non-volatile memory which is provided in the memory 60 when manufacturing the oscillator circuit 2, and the set value is written in each register from the non-volatile memory when supplying power after assembling the oscillator 1. In addition, for example, when manufacturing the oscillation circuit, in the non-volatile memory, the temperature compensated data (each of a 0-order, a 1st-order, and a 3rd-order coefficient value (may include each of a 4th-order or a 5th-order coefficient value) according to the frequency temperature characteristics of the resonator 3, or a correspondence table of the temperature and the temperature compensated voltage) (data for controlling the temperature compensated circuit 40) which is input into the temperature compensated circuit 40, is also stored.

Configuration of Circuit for Oscillation

Figure 2:
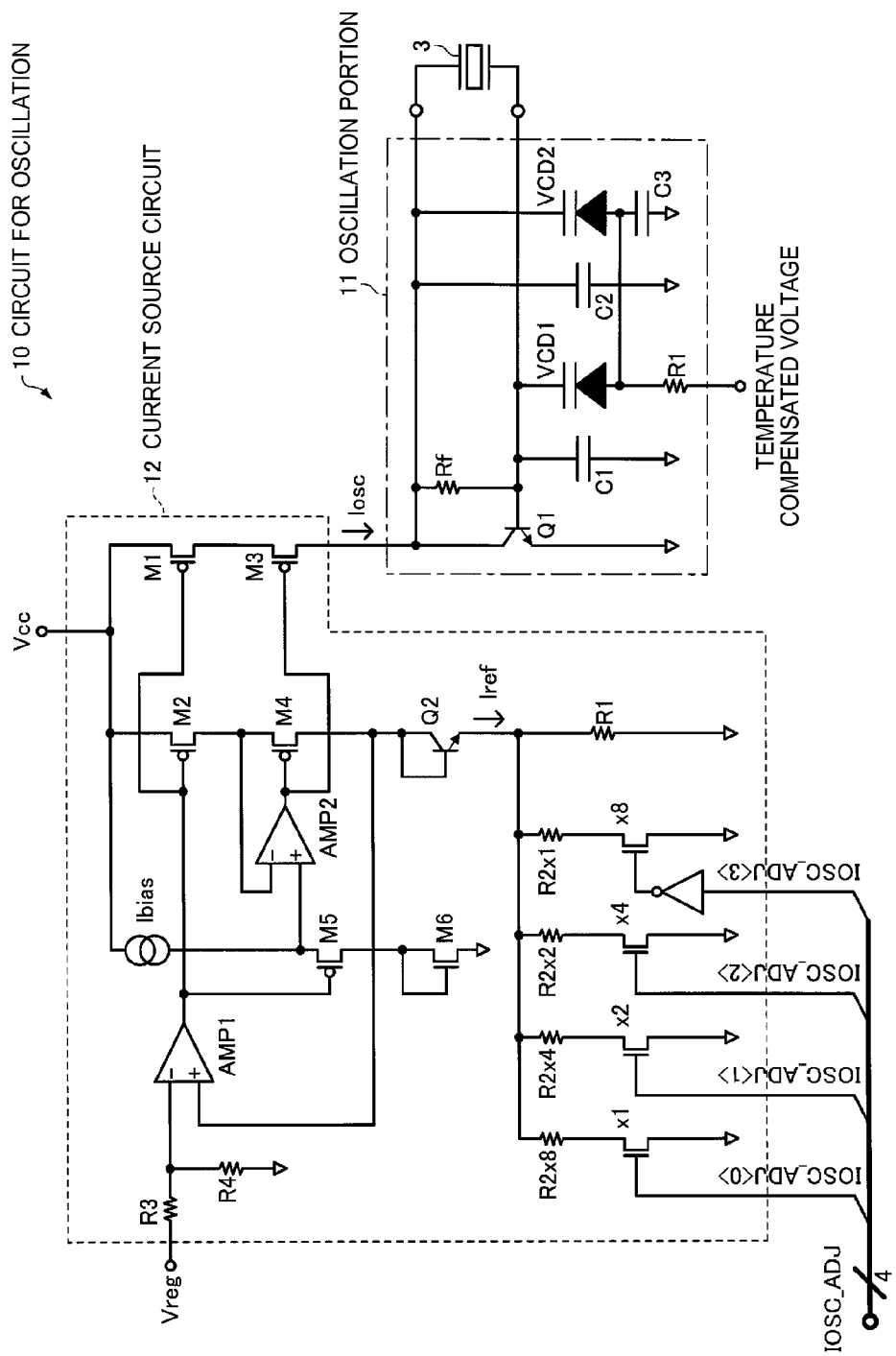
FIG. 2 is a view illustrating a configuration example of a circuit for oscillation.

FIG. 2 is a view illustrating a configuration example of the circuit for oscillation 10 in FIG. 1. As illustrated in FIG. 2, the circuit for oscillation 10 is provided with an oscillation portion 11 and a current source circuit 12. The oscillation portion 11 constitutes a pierce type oscillation circuit by being connected to the resonator 3. In the oscillation portion 11, varicap diodes VCD1 and VCD2, which are the variable capacitance elements connected in parallel to the resonator 3, are connected to each other in series, a capacity value of the oscillation portion 11 is changed with respect to the temperature by applying a temperature compensated voltage to the varicap diodes VCD1 and VCD2, and the oscillation signal in which the frequency temperature characteristics of the resonator 3 is compensated is output.

By a current adjustment portion in which a differential amplifier AMP1, a PMOS transistor M2, a bipolar transistor Q2, and a resistor R1 are connected in parallel to a plurality of resistors R2, the current source circuit 12 generates a current Iref which is a reference of an oscillation step current Iosc. The reference current Iref is adjusted by the set value of the IOSC_ADJ of four bits. A size of a gate width of a PMOS transistor M1 and a size of a gate width of the PMOS transistor M2 have a ratio of 10:1, for example. A size of a gate width of a PMOS transistor M3 and a size of a gate width of a PMOS transistor M4 have also the same size ratio. For example, when Iref=20 μA, 200 μA which is 10 times higher is supplied to the oscillation portion 11 as the oscillation step current. A circuit, which is configured of a differential amplifier AMP2, the PMOS transistor M4, a current source which flows in a bias current Ibias, and PMOS transistors M5 and M6, is a circuit for further suppressing a dependence of the oscillation step current Iosc which flows to the cascode-connected PMOS transistors M1 and M3, on a power source. In the TCXO which requires a high frequency system, the circuit is a circuit in which the dependence of the current output by the current source on the power source is further reduced than that of a cascode circuit, and is a gain-enhancing type cascode circuit. The cascade circuit monitors the source voltage of the PMOS transistor M4 on a reference side, controls a gate voltage of the PMOS transistors M3 and M4 by the differential amplifier AMP2 when the source voltage (voltage of the Vcc terminal) is changed, and further controls a change in a potential difference between source-drains of the PMOS transistors M1 and M2. An output resistance of the current source circuit 12 further increases only by gain-multiplying the differential amplifier AMP2. The oscillation step current Iosc is stabilized with respect to a change of power source voltage, and an oscillation frequency change of the oscillation portion 11 is suppressed.

Configuration of Output Circuit

Figure 3:
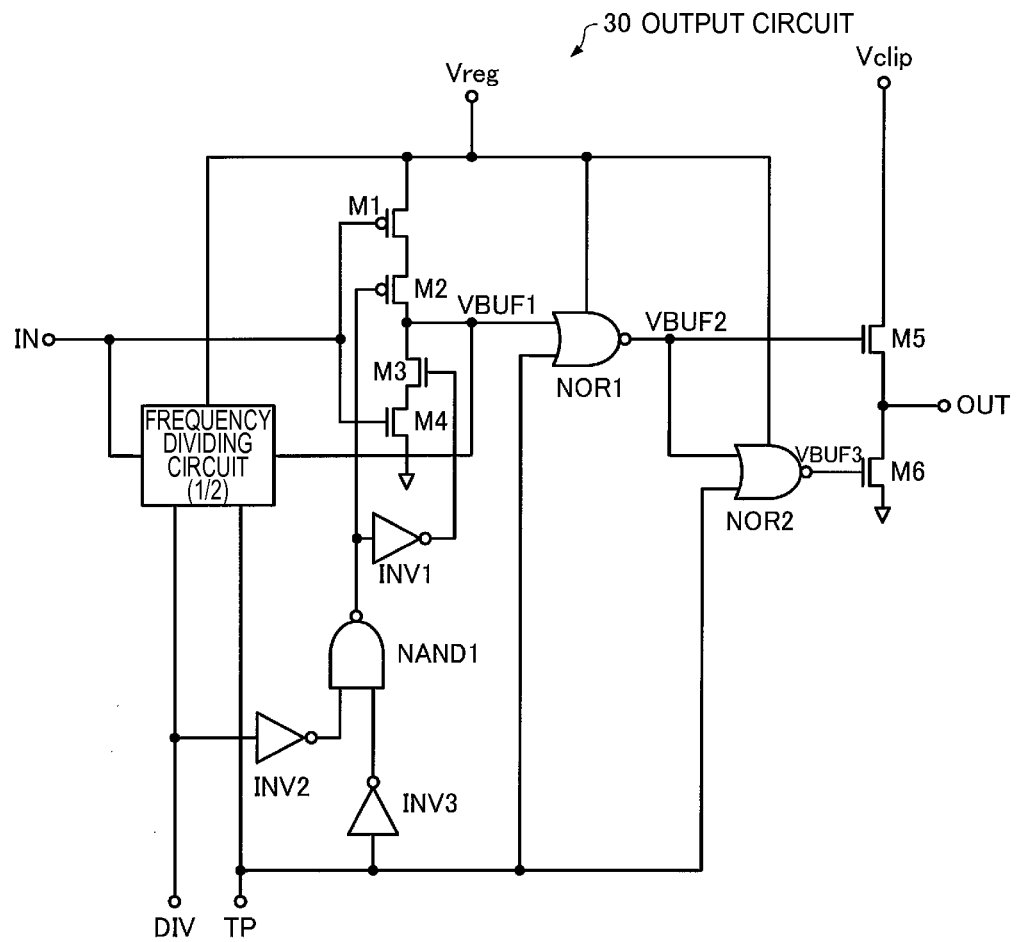
FIG. 3 is a view illustrating a configuration example of an output circuit in the oscillator according to the first embodiment.

FIG. 3 is a view illustrating a configuration example of the output circuit 30 in FIG. 1. As illustrated in FIG. 3, in the output circuit 30, the output voltage Vreg of the regulator circuit 50 is applied to a Vreg terminal, and a clipped voltage Vclip for obtaining a clipped sine wave output which is generated by the amplitude control circuit 20 is applied to the Vclip terminal. The output circuit 30 is provided with a frequency dividing circuit, and is configured to be selectable whether or not a signal (the oscillation signal output by the circuit for oscillation 10) input into an IN terminal is divided into two by a voltage level of a DIV terminal. In the embodiment, when a set value of the frequency dividing switching register DIV is 0, the DIV terminal is set to be at a low level, the input signal is not divided, a polarity is inverted by an inverter which is made of MOS transistors M1 to M4, and a signal of a node VBUF1 is transferred to a NOR circuit NOR1. Meanwhile, when the set value of the frequency dividing switching register DIV is 1, the DIV terminal is set to be at a high level, the input signal is divided into ½ by the frequency dividing circuit, and the signal of the node VBUF1 is transferred to the NOR circuit NOR1.

In addition, the output circuit 30 is in an operable state when the TP terminal is at a low level, and is in an operation stop state when the TP terminal is at a high level. When normally operating, the TP terminal is set to be at a low level, the input signal from the input terminal IN is clipped at a voltage amplitude level determined by the Vclip, and the signal is output from the OUT terminal. When adjusting (testing) the temperature compensated circuit 40 in FIG. 1, the TP terminal is set to be at a high level, MOS transistors M2 and M3 are OFF, an output node VBUF2 of the NOR circuit NOR1 and an output node VBUF3 of a NOR circuit NOR2 are grounding potentials, and an NMOS transistors M5 and M6 are in an OFF state. Accordingly, the output circuit 30 is in an operation stop state.

Configuration of Amplitude Control Circuit

Figure 4:
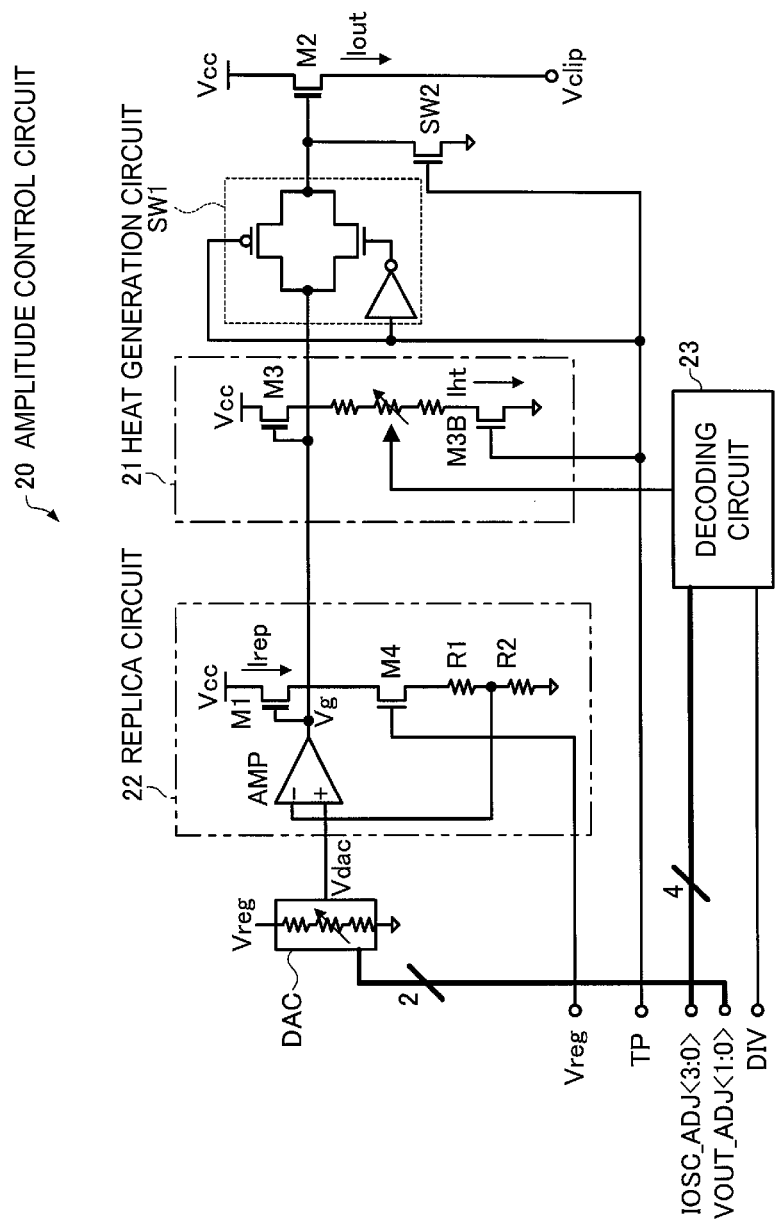
FIG. 4 is a view illustrating a configuration example of an amplitude control circuit in the oscillator according to the first embodiment.

FIG. 4 is a view illustrating a configuration example of the amplitude control circuit 20 in FIG. 1. As illustrated in FIG. 4, NMOS transistors M1, M2, and M3 are depression type MOS transistors, and other MOS transistors are normal type (enhancement type) MOS transistors. By flowing a static current (DC current) Iht when adjusting the temperature compensated circuit 40, the amplitude control circuit 20 illustrated in FIG. 4 generates heat which corresponds to the heat generated by the output circuit 30 when normally operating. Accordingly, a change in the heat generation amount between when normally operating and when adjusting the temperature compensated circuit 40 is suppressed.

As illustrated in the following Formula (1), the clipped voltage Vclip which determines the output amplitude level of the output circuit 30 is a voltage which subtracts a voltage VgsM2 between gate sources of the MOS transistor M2 from an output voltage Vg of a differential amplifier AMP.

$$V\text{clip} = Vg - Vgs_{M2} \quad (1)$$

The Vg is obtained by the following Formula (2) from an analog voltage Vdac which is D/A converted by a D/A converter DAC based on data given by the output level adjustment register VOUT_ADJ.

$$Vg = Vdac \cdot \left(\frac{R1}{R2} + 1\right) + Vgs_{M1} \quad (2)$$

By substituting Formula (2) for Formula (1), a relationship of the following Formula (3) is valid. In other words, the clipped voltage Vclip is determined by Vdac·(R1/R2+1) which is a voltage made by amplifying the output voltage Vdac of the D/A converter DAC by the differential amplifier AMP.

$$V\text{clip} + Vgs_{M2} = Vdac \cdot \left(\frac{R1}{R2} + 1\right) + Vgs_{M1} \quad (3)$$

When normally operating, the TP terminal is set to be at a low level, a switch circuit SW1 is in an ON state, an NMOS switch SW2 is in an OFF state, an MOS transistor M3B is in an OFF state, and a heat generation circuit 21 is in an operation stop state. Meanwhile, when adjusting the temperature compensated circuit 40, the TP terminal is set to be at a high level, the switch circuit SW1 is in an OFF state, the NMOS switch SW2 is in an ON state, and thus, an NMOS transistor M2 is in a block state, and the heat generation circuit 21 including an NMOS transistor M3 is in an operation state.

Figure 6A:
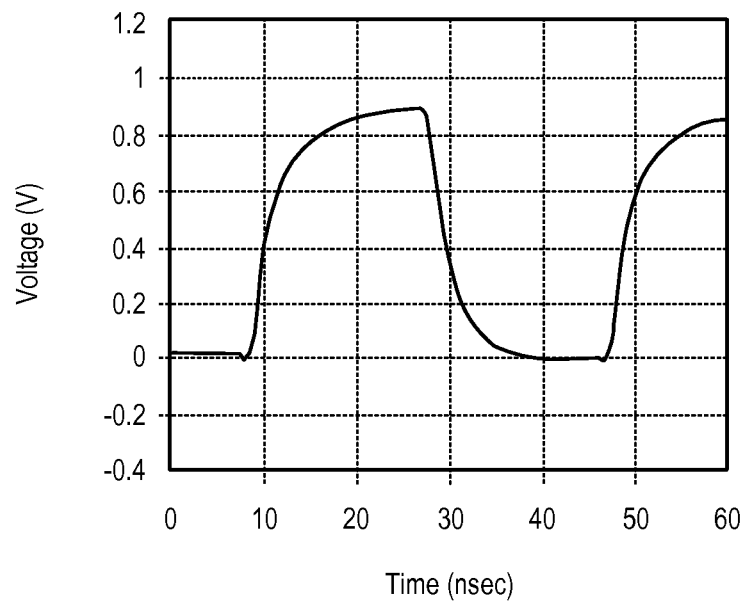
FIGS. 6A and 6B are views illustrating an example of an output wave form of a clipped sine wave.
Figure 6B:
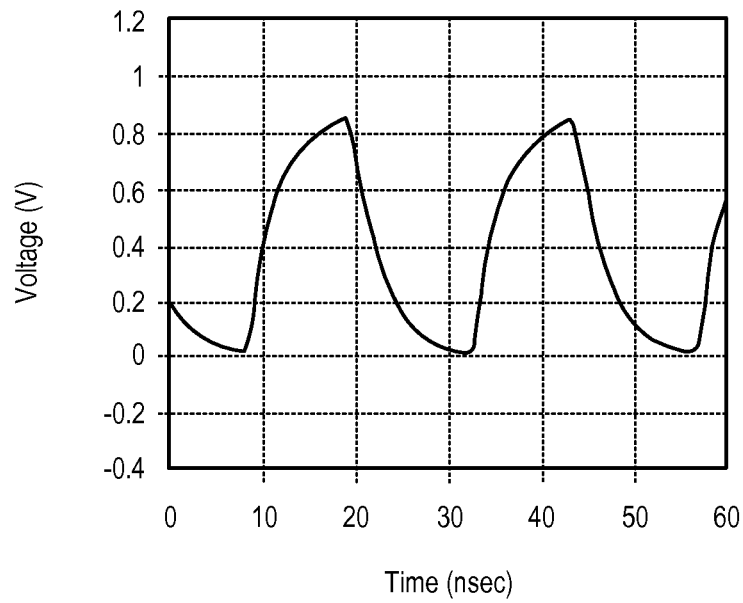

A wave form which is output by the output circuit 30 is the clipped sine wave illustrated in FIGS. 6A and 6B, and a peak value (amplitude) of the clipped sine wave decreases as the output frequency increases. For this reason, the set value of the output level adjustment register VOUT_ADJ is selected by matching the output frequency. In general, the set value of the output level adjustment register VOUT_ADJ is selected so that it is possible to ensure the amplitude of the clipped sine wave to be equal to or greater than 0.8 Vpp. In FIG. 5, an example of a relationship between the set value of the output level adjustment register VOUT_ADJ, the output voltage Vdac of the D/A converter DAC, and the clipped voltage Vclip, is illustrated. FIG. 5 is an example of a case where the gain of a replica circuit 22 including the differential amplifier AMP is set to be an approximately 1.2 times greater gain, and the clipped voltage Vclip illustrates a DC voltage value. In addition, FIGS. 6A and 6B are views illustrating an example of the output wave form of the clipped sine wave when the output frequency is respectively 26 MHz and 52 MHz, and the VOUT_ADJ is set to be "01". As illustrated in FIG. 5, when the VOUT_ADJ is set to be "01", the clipped voltage Vclip is 0.9 V. As illustrated in FIG. 6A, when the output frequency is 26 MHz, the amplitude of the clipped sine wave is approximately 0.9 Vpp. As illustrated in FIG. 6B, even when the output frequency is 52 MHz, the amplitude of the clipped sine wave can ensure approximately 0.82 Vpp. In addition, when the output frequency is 52 MHz, there is a case where the amplitude of the clipped sine wave slightly decreases, and the amplitude can be 0.92 Vpp by setting the VOUT_ADJ to be "10" and increasing the amplitude by 0.1 V.

Figure 7:
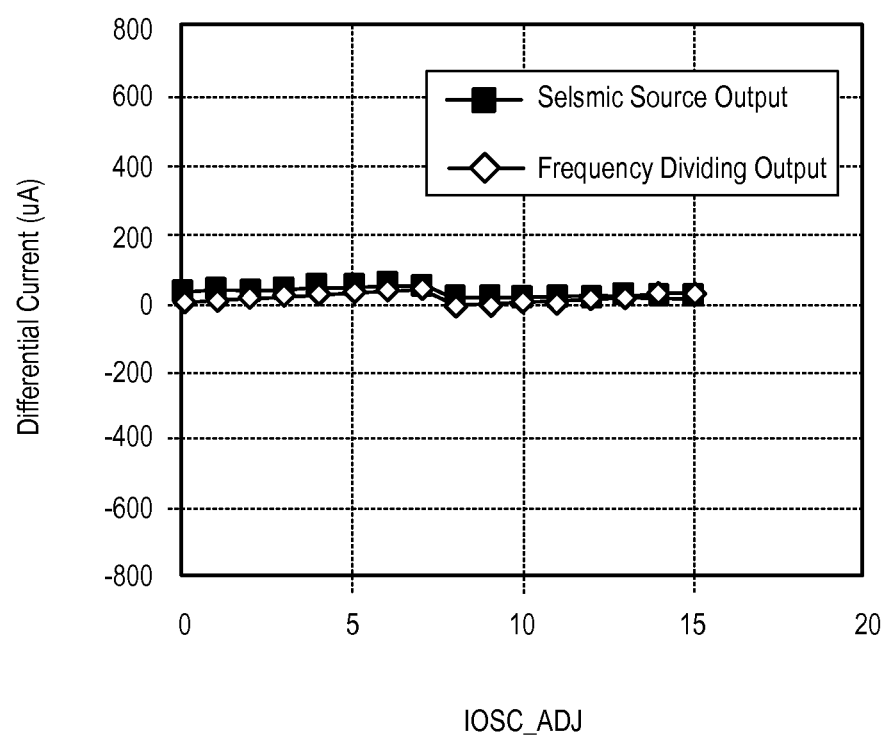
FIG. 7 is a view illustrating a relationship between a set value of an oscillation step current adjustment register in the oscillator according to the first embodiment and a differential current.

In the embodiment, the current Iht, which flows in the heat generation circuit 21 when the TP terminal is set to be at a high level, is interlocked with the set value of the oscillation step current adjustment register IOSC_ADJ, the set value of the frequency dividing switching register DIV, and the set value of the output level adjustment register VOUT_ADJ, and is changed. When the TP terminal is set to be at a low level, the current Iht is close to a current which corresponds to the current consumed by the output circuit 30. Accordingly, a differential current, which is a current of a difference between a consumption current of the oscillator 1 when the TP terminal is set to be at a low level and a consumption current of the oscillator 1 when the TP terminal is set to be at a high level, is small. In other words, by making the difference between a current when the output circuit 30 is in an operation state and a current when the output circuit 30 is in an operation stop state small, the change in the heat generation amount of the circuit for oscillation 10 is suppressed. As an example, FIG. 7 illustrates a relationship between the set value of the oscillation step current adjustment register IOSC_ADJ and the differential current. In FIG. 7, a relationship between when the set value of the frequency dividing switching register DIV is 0 (at a time of seismic source output) and when the set value of the frequency dividing switching register DIV is 1 (at a time of frequency dividing output) is illustrated. As illustrated in FIG. 7, in the oscillator 1 of the embodiment, even when the register value of the IOSC_ADJ or the DIV are separately set according to the oscillation frequency, or the presence or the absence of the output frequency division, it is possible to reduce the difference between the current when the output circuit 30 is in an operation state and the current when the output circuit 30 is in an operation stop state, and the differential current can successfully be close to 0.

In addition, the heat generation circuit 21 functions as the heat generation portion, and a circuit other than the heat generation circuit 21 among the amplitude control circuits 20 functions as the amplitude control portion.

Manufacturing Method of Oscillator

Figure 8:
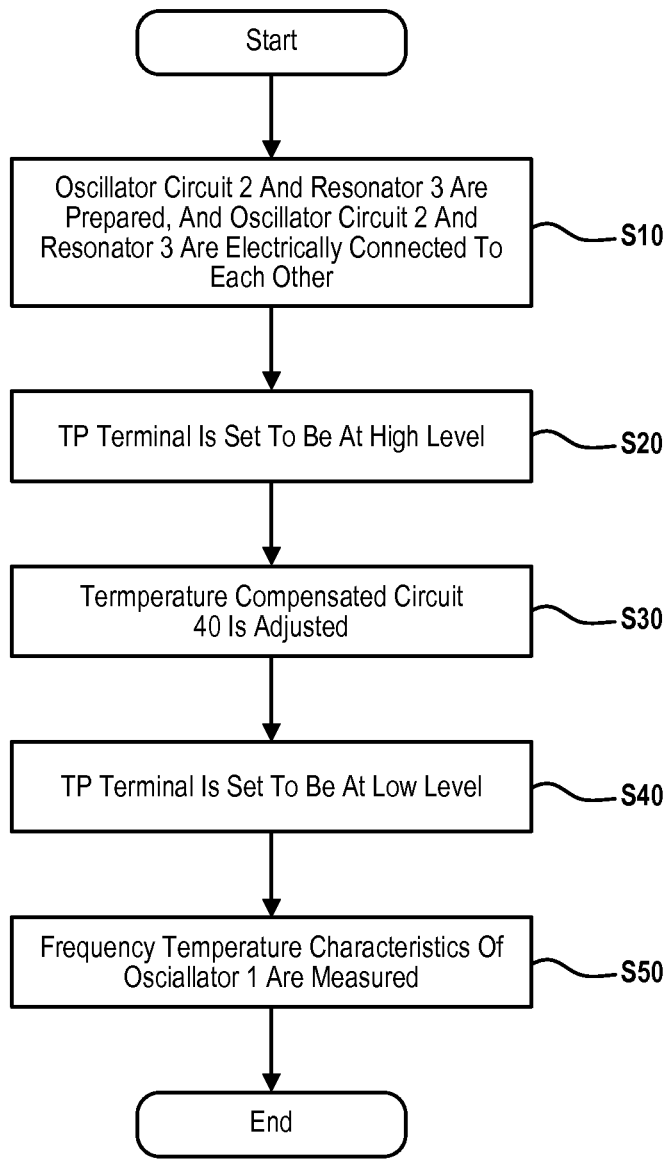
FIG. 8 is a flow chart illustrating an example of a manufacturing method of the oscillator.

FIG. 8 is a flow chart illustrating an example of a manufacturing method of the oscillator of the embodiment. The manufacturing method of the oscillator of the embodiment includes steps S10 to S50 illustrated in FIG. 8. However, the manufacturing method of the oscillator of the embodiment may omit or change apart of the steps S10 to S50, or may add another step.

As illustrated in FIG. 8, in the embodiment, first, the oscillator circuit 2 and the resonator 3 are prepared, and the oscillator circuit 2 and the resonator 3 are electrically connected to each other (step S10).

Next, the TP terminal is set to be at a high level (step S20). By the step S20, the switch circuit 70 is controlled so that the temperature compensated circuit 40 and the OUT terminal are electrically connected to each other, is controlled so that the output from the output circuit 30 is stopped, and is controlled so that the current based on an operation (operation according to the set value of the oscillation step current adjustment register IOSC_ADJ and the set value of the output level adjustment register) of the circuit for oscillation 10 and the amplitude control portion of the amplitude control circuit 20 flows to the heat generation circuit 21.

Next, the temperature compensated circuit 40 is adjusted (step S30). Specifically, at step S30, at a plurality of temperatures determined in advance, a compensated voltage which is output by the temperature compensated circuit 40 from the OUT terminal is monitored while temperature compensated data is changed, and the temperature compensated data which is optimum for compensating the frequency temperature characteristics of the resonator 3 is determined.

Next, the TP terminal is set to be at a low level (step S40). By the step S40, the switch circuit 70 is controlled so that the temperature compensated circuit 40 and the OUT terminal are not electrically connected to each other, is controlled so that the oscillation signal is output from the output circuit 30, and is controlled so that the current does not flow to the heat generation circuit 21.

Next, the frequency temperature characteristics of the oscillator 1 is measured (step S50). Specifically, at step S50, the temperature compensated data determined by the step S30 is set to the temperature compensated circuit 40, and at a plurality of temperatures determined in advance, the frequency of the oscillation signal output from the OUT terminal is measured. Then, the measured frequency temperature characteristics are confirmed, and the frequency temperature characteristics are written into the non-volatile memory provided in the memory 60 if the frequency temperature characteristics satisfy a predetermined reference (specification). In addition, if the measured frequency temperature characteristics do not satisfy the predetermined reference (specification), the steps following the step S20 may be performed again, and the oscillator may be discarded as a rejected product.

In addition, if the non-volatile memory provided in the memory 60 is an EEPROM or a flash memory which can perform writing multiple times, at a stage of determining the optimum temperature compensated data at the step S30, the temperature compensated data may be written into the non-volatile memory provided in the memory 60, the step S50 may be a step at which the frequency temperature characteristics of the oscillator 1 are measured. At the step S50, when the measured frequency temperature characteristics do not satisfy the predetermined reference (specification), it is preferable that the steps following the step S20 be performed again, but the oscillator may be discarded as a rejected product.

Figure 9:
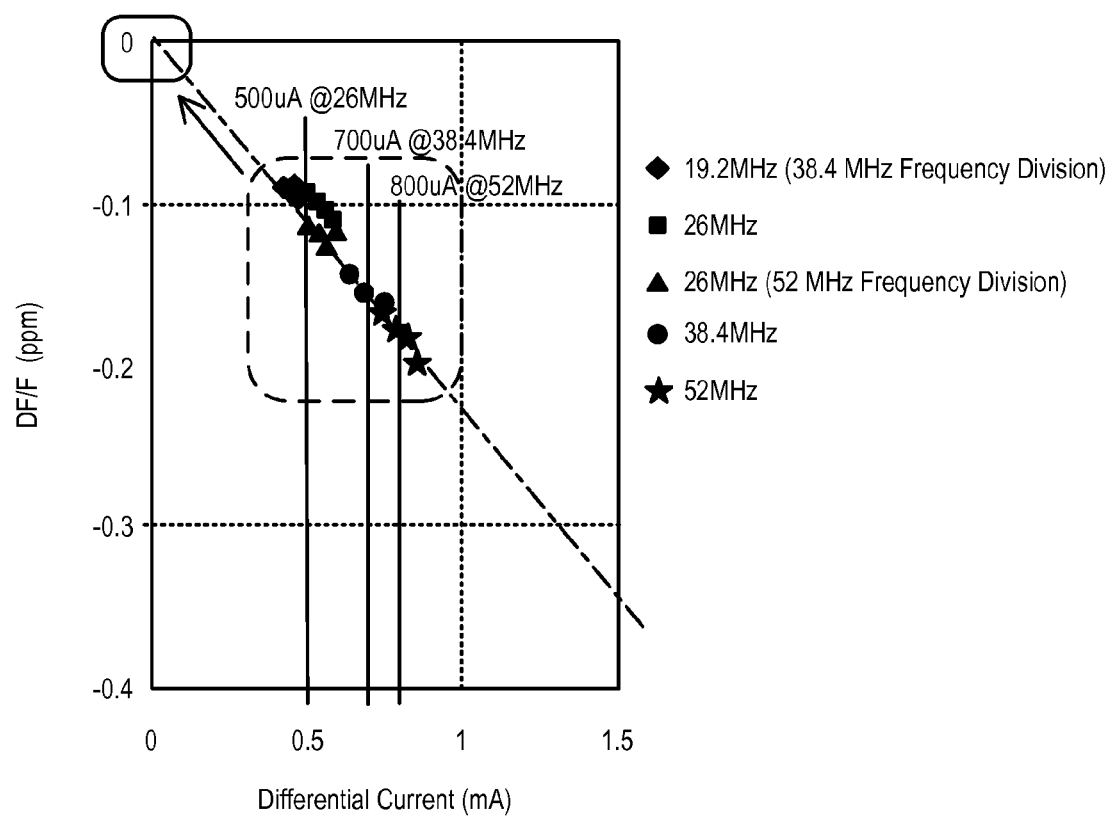
FIG. 9 is a view illustrating a relationship between a differential current and a frequency compensation error in the oscillator according to the first embodiment and in the oscillator in the related art.

As described above, according to the oscillator 1 of the first embodiment, as illustrated in FIG. 7, since the differential current between the consumption current when normally operating and the consumption current when adjusting the temperature compensated circuit 40 is small, the difference between the heat generation amount of the entire oscillator 1 when the TP terminal is set to be at a low level (when normally operating) and the heat generation amount of the entire oscillator 1 when the TP terminal is set to be at a high level (when adjusting the temperature compensated circuit 40) is reduced. For this reason, the temperature difference of the oscillator 1 is also small. Therefore, it is possible to make the frequency temperature compensation error when normally operating small. FIG. 9 is a view illustrating a relationship between the differential current and a frequency compensation error in the oscillator 1 according to the embodiment and in the oscillator in the related art. As illustrated in FIG. 9, while the differential current is approximately 500 µA to 800 µA in the oscillator in the related art and the frequency temperature compensation error (DF/F) is approximately 100 ppb to 200 ppb (a part which is surrounded by a dotted line), according to the oscillator 1 of the embodiment, it is possible to make the differential current and the frequency temperature compensation error (DF/F) close to 0 (a part which is surrounded by the dotted line).

In this manner, according to the oscillator 1 of the embodiment, when adjusting the temperature compensated circuit, as the DC current Iht which flows to the heat generation circuit 21 is interlocked with each set value of the oscillation step current adjustment register IOSC_ADJ selected according to the frequency of the resonator 3 and the output level adjustment register VOUT_ADJ or with the set value of the frequency dividing switching register DIV, and is changed, it is possible to generate a current which corresponds to the current consumed by the output circuit 30 when normally operating, with high accuracy. For this reason, the frequency temperature compensation, in which the frequency temperature compensation error is suppressed by reducing the differential current and which has high accuracy, is possible. In particular, the effect thereof is large as the output frequency increases. In addition, in the heat generation circuit 21, an AC signal (AC current, AC voltage, or the like) is not used as an energy source, and generation of a change in the voltage or the current according to a time change is reduced. For this reason, it is possible to reduce a possibility that the signal generated from the heat generation circuit 21 influences another circuit such as noise.

In addition, according to the oscillator 1 of the embodiment, the heat generation circuit 21 is realized as a small-sized circuit having a simple configuration on the inside of the amplitude control circuit 20. Accordingly, it is not required to provide a switch circuit between the heat generation circuit which has the same driving capability as that of the output circuit 30 or the circuit for oscillation 10, and the output circuit 30, and it is possible to suppress an increase in a circuit scale.

1-2. Second Embodiment

In the oscillator 1 according to the first embodiment, when normally operating, if the output frequency increases, an output current Iout increases according to this. Then, a deviation of a ratio between the current which flows to the NMOS transistor M2 and the current which flows to the NMOS transistor M1 that constitutes the replica circuit 22 increases, an influence of a temperature dependence of a gain constant β of the NMOS transistor M2 increases, the temperature characteristics of the clipped voltage Vclip deteriorates, and the temperature characteristics of a voltage amplitude of the clipped sine wave which is output by the output circuit 30 deteriorates (the temperature dependency increases). Since an effective gate voltage Veff of the MOS transistor is given by the following Formula (4), Formula (3) can be rewritten like Formula (5).

$$Veff = Vgs - Vth \qquad (4)$$

$$Vclip + (Veff_{M2} + Vth) = Vdac \cdot \left(\frac{R1}{R2} + 1\right) + (Veff_{M1} + Vth) \qquad (5)$$

In Formula (5), a Vth is a threshold value voltage. When the NMOS transistors M1 and M2 are configured of the same type of transistor, it is possible to consider that the Vth of the NMOS transistors M1 and M2 are substantially the same as each other. Here, the effective gate voltage VeffM1 and VeffM2 of the NMOS transistors M1 and M2 expressed in Formula (5), has drawn attention.

A drain current Irep in a saturation area of the NMOS transistor M1 of the replica circuit 22 can be given by the following Formula (6). In Formula (6), u0 is mobility of a carrier, Cox is an oxide film capacity, WM1 and LM1 are respectively a gate width and a gate length of the NMOS transistor M1. In addition, in order to simplify the description, an influence of a channel length modulation effect is omitted from the description in Formula (6).

$$Irep = \frac{1}{2} u_0 C_{ox} \frac{W_{M1}}{L_{M1}} (Vgs_{M1} - Vth)^2 \quad (6)$$

When Formula (6) is further modified by using Formula (4) and is rewritten to express the effective gate voltage VeffM1 of the NMOS transistor M1, a relationship of the following Formula (7) is derived.

$$Veff_{M1} = \sqrt{\frac{2 \cdot Irep}{u_0 C_{ox} \frac{W_{M1}}{L_{M1}}}} = \sqrt{\frac{2 \cdot Irep}{\beta_{M1}}} \quad (7)$$

Similarly, the effective gate voltage VeffM2 of the NMOS transistor M2 is expressed in the following Formula (8).

$$Veff_{M2} = \sqrt{\frac{2 \cdot Iout}{u_0 C_{ox} \frac{W_{M2}}{L_{M2}}}} = \sqrt{\frac{2 \cdot Iout}{\beta_{M2}}} \quad (8)$$

In Formulas (7) and (8), when the output frequency is low (for example, when the output frequency is equal to or less than 26 MHz), since deviation between an aspect ratio of W and L of the NMOS transistors M1 and M2, and a ratio of each of the current Irep and the current Iout is small, the effective gate voltage is kept with a substantially excellent balance. However, when the output frequency is high (for example, when the output frequency is equal to or greater than 52 MHz), the output current Iout increase, and an influence of a gain constant βM2 of the NMOS transistor M2 increases.

In general, it is known that the gain constant β has negative temperature characteristics since a mobility u of the carrier deteriorates as the temperature in the MOS transistor increases. However, since the influence of the temperature characteristics of the gain constant βM2 of the NMOS transistor M2 increases as the output current Iout increases, the temperature characteristics of the clipped voltage Vclip of the amplitude control circuit 20 illustrated in FIG. 4 deteriorates, and as a result, the temperature characteristics of the output voltage amplitude of the clipped sine wave which is output by the output circuit 30 deteriorates. In addition, even the NMOS transistor M3 of the heat generation circuit 21 can be similar.

Figure 10:
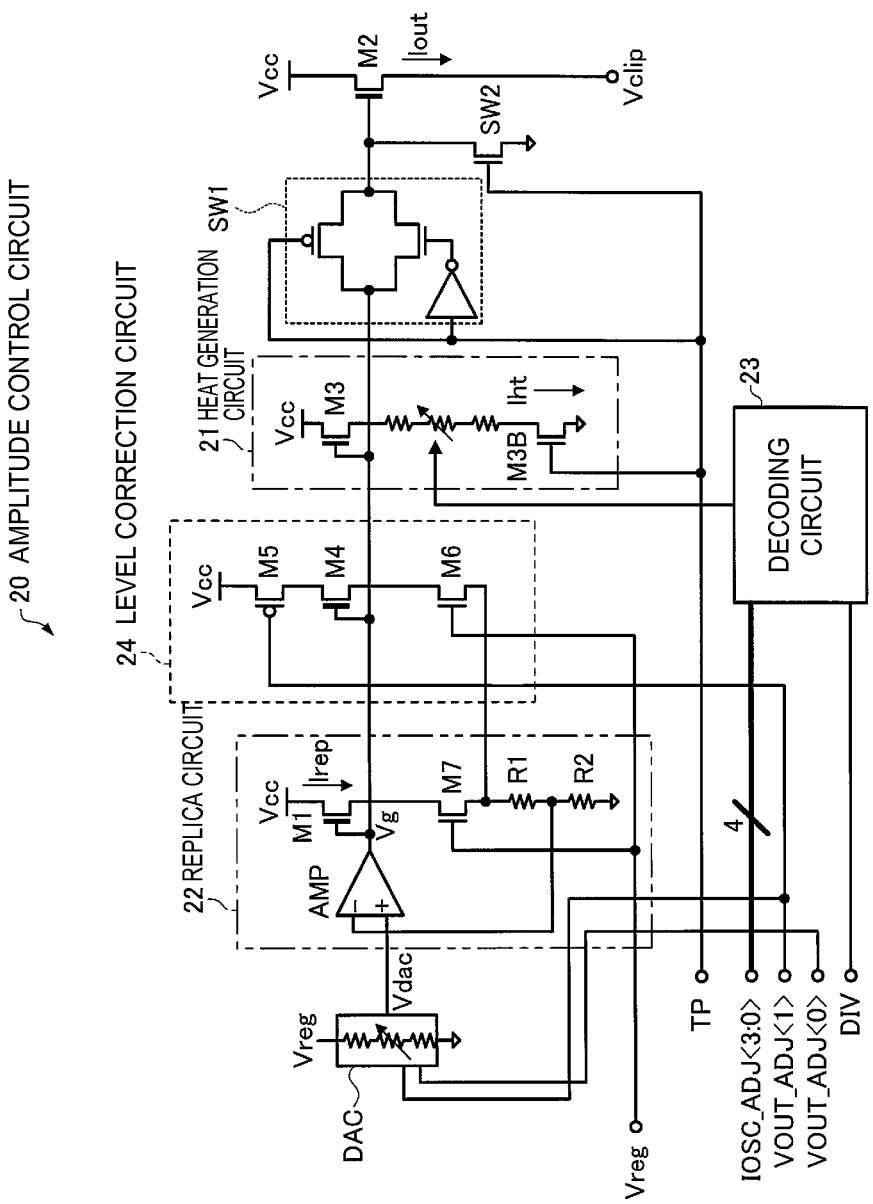
FIG. 10 is a view illustrating a configuration example of an amplitude control circuit in an oscillator according to a second embodiment.

Here, in the oscillator 1 of the second embodiment, a level correction function for improving the above-described influence to the amplitude control circuit 20 is added. FIG. 10 is a view illustrating a configuration example of the amplitude control circuit 20 in the oscillator 1 according to the second embodiment. In FIG. 10, the NMOS transistors M1, M2, M3, and M4 are the depression type MOS transistors, and other MOS transistors are the normal type (enhancement type) MOS transistors. As illustrated in FIG. 10, the amplitude control circuit 20 in the oscillator 1 of the second embodiment is provided with a level correction circuit 24 for controlling a size of the clipped voltage Vclip which controls the amplitude of the oscillation signal output by the output circuit 30, based on an operation state of amplitude control portion.

The output frequency and the output current Iout are in a substantially proportional relationship, and in a relationship in which the set value of the output level adjustment register VOUT_ADJ also increases as the frequency increases. When the output frequency is low, in order to decrease the output current Iout, a high-order bit of the output level adjustment register VOUT_ADJ is set to be 0. For this reason, the PMOS transistor M5 of the level correction circuit 24 is in an ON state, and the current which flows in the MOS transistors M4, M5, and M6 of the level correction circuit 24 in addition to the Irep also flows to the resistors R1 and R2 of the replica circuit 22. Meanwhile, when the output frequency is high, in order to increase the output current Iout, the high-order bit of the VOUT_ADJ is set to be 1. For this reason, the PMOS transistor M5 of the level correction circuit 24 is in an OFF state, and only the Irep flows to the resistors R1 and R2 of the replica circuit 22. In a case of the current which flows to the resistors R1 and R2, since a constant current flows based on the analog voltage Vdac which is D/A converted by the D/A converter DAC and the resistor R2, the current Irep when the output frequency is high (when the high-order bit of the VOUT_ADJ is set to be 1) is greater than the current Irep when the output frequency is low (when the high-order bit of the VOUT_ADJ is set to be 0). Therefore, if a ratio Irep/Iout between the Irep and the Iout when the output frequency is low (when the high-order bit of the VOUT_ADJ is set to be 0) is calculated to the same extent as that of the first embodiment, the Irep/Iout when the output frequency is high (when the high-order bit of the VOUT_ADJ is set to be 1) is greater than that of the first embodiment. Therefore, a deviation between the ratio between the Irep and the Iout when the output frequency is low (when the high-order bit of the VOUT_ADJ is set to be 0) and the ratio between the Irep and the Iout when the output frequency is high (when the high-order bit of the VOUT_ADJ is set to be 1), is smaller in the second embodiment than in the first embodiment. Similarly, the deviation of the ratio between the Irep and the Iht also decreases. As a result, the amplitude control circuit 20 in the second embodiment operates so that a deviation of the effective gate voltages of each of the NMOS transistors M1, M2, and M3 is reduced.

Since another configuration of the amplitude control circuit 20 in the second embodiment is similar to that of the amplitude control circuit 20 in the first embodiment, the description thereof will be omitted. In addition, since the entire configuration of the oscillator 1, the configuration of the circuit other than the amplitude control circuit 20, and the manufacturing method of the oscillator 1 of the second embodiment are also similar to those in the oscillator 1 of the first embodiment, the drawings and the descriptions thereof will be omitted.

According to the oscillator 1 of the second embodiment, as the deviation of the effective gate voltages of the NMOS transistors M1 and M2 is reduced, it is possible to improve the temperature characteristics of the output amplitude level, and to reliably keep the output amplitude level across a wide frequency range from a case where the output frequency is low (for example, equal to or less than 26 MHz) to a case where the output frequency is high (for example, equal to or greater than 52 MHz).

In addition, according to the oscillator 1 of the second embodiment, as the deviation of the effective gate voltages of the NMOS transistors M1 and M3 is reduced, when adjusting the temperature compensated circuit 40 (when the TP terminal is at a high level), it is possible to suppress a variation of the heat generation amount. For this reason, the frequency temperature compensation is possible with higher accuracy.

1-3. Third Embodiment

Figure 11:
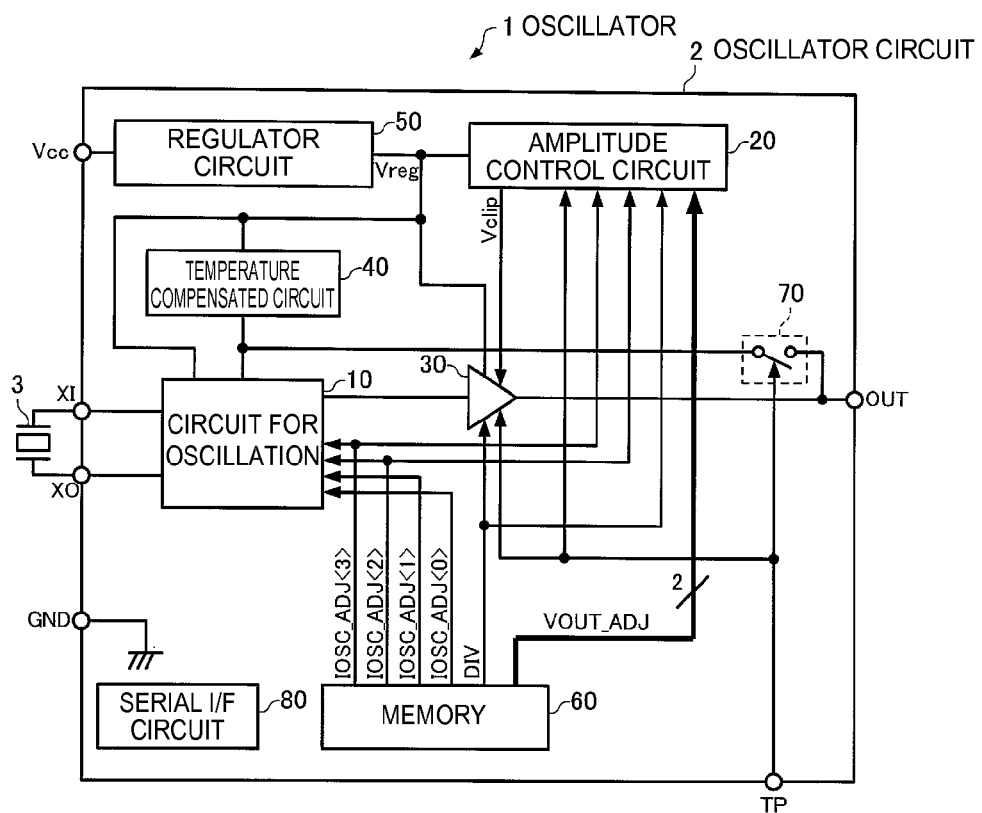
FIG. 11 is a configuration view of an oscillator according to a third embodiment.
Figure 12:
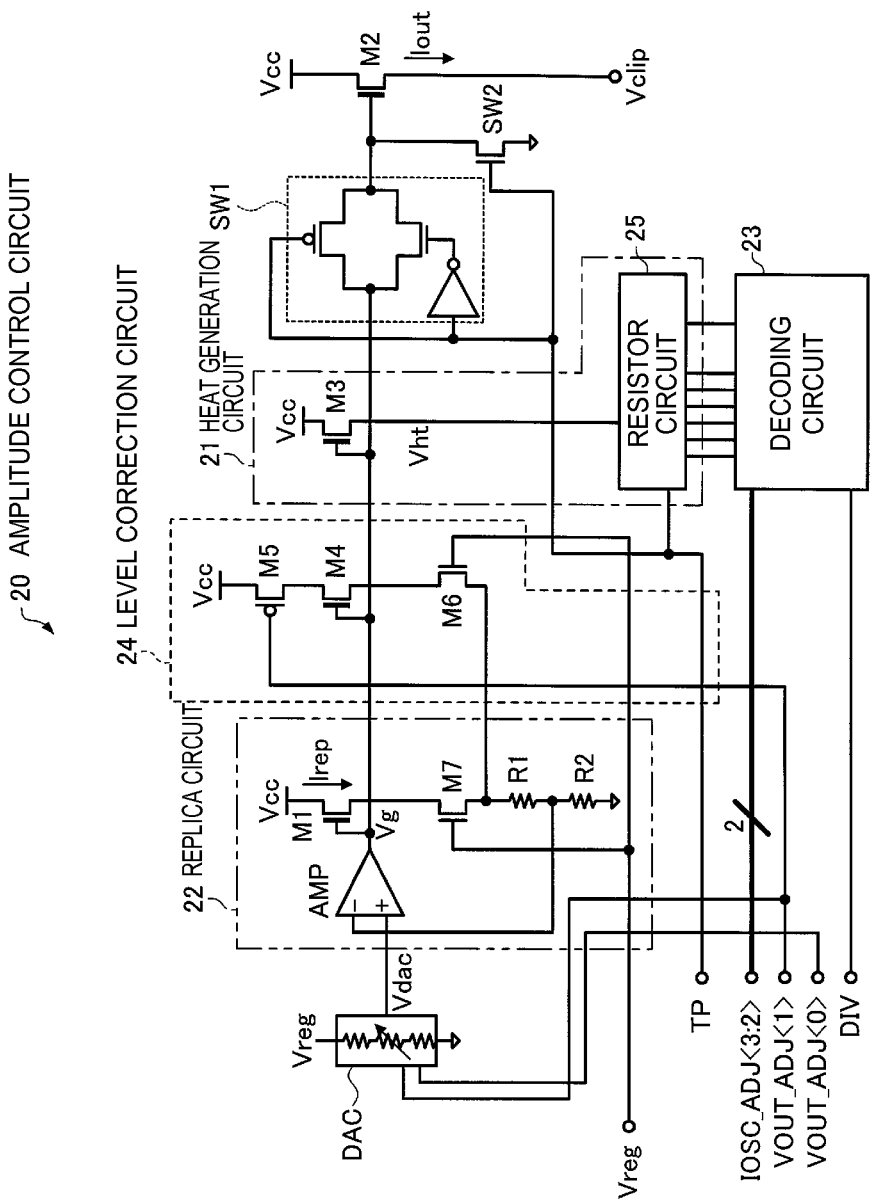
FIG. 12 is a view illustrating a configuration example of an amplitude control circuit in the oscillator according to the third embodiment.

FIG. 11 is a configuration view of the oscillator 1 according to a third embodiment. In addition, FIG. 12 is a view illustrating a configuration example of the amplitude control circuit 20 in the oscillator 1 according to the third embodiment. As illustrated in FIGS. 11 and 12, the amplitude control circuit 20 in the third embodiment controls an amount of the current which flows to the heat generation circuit 21 by high-order 2 bits of the oscillation step current adjustment register IOSC_ADJ, 1 bit of the frequency dividing switching register DIV, and 2 bits of the output level adjustment register VOUT_ADJ. In other words, in the second embodiment, the amplitude control circuit 20 controls the amount of the current which flows to the heat generation circuit 21 by using all 4 bits of the oscillation step current adjustment register IOSC_ADJ. However, in the third embodiment, the amplitude control circuit 20 controls the amount of the current which flows to the heat generation circuit 21 by using the high-order 2 bits of the oscillation step current adjustment register IOSC_ADJ.

Figure 13:
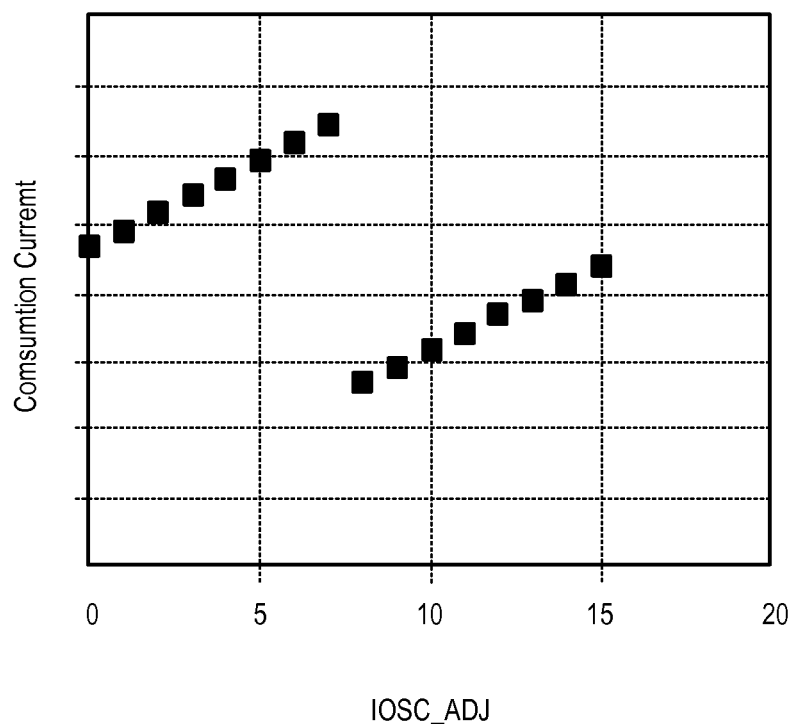
FIG. 13 is a view illustrating a relationship between a set value of an oscillation step current adjustment register in the oscillator according to the third embodiment and a consumption current of the oscillator.

FIG. 13 is a view illustrating one example of a relationship between the set value of the oscillation step current adjustment register IOSC_ADJ and the consumption current of the oscillator 1. In the embodiment, when the memory 60 is in an initial state, for example, when the set value of the oscillation step current adjustment register IOSC_ADJ is 0, the consumption current is close to a central value. A decoding circuit 23 has a configuration in which a similar relation to a case where the consumption current of the oscillator 1 is close to the central value when the memory 60 is in an initial state, in particular, when the set value of the IOSC_ADJ is in an initial state, is kept, and a current setting of the heat generation circuit 21 according to the set value of the IOSC_ADJ, is decoded.

Figure 14:
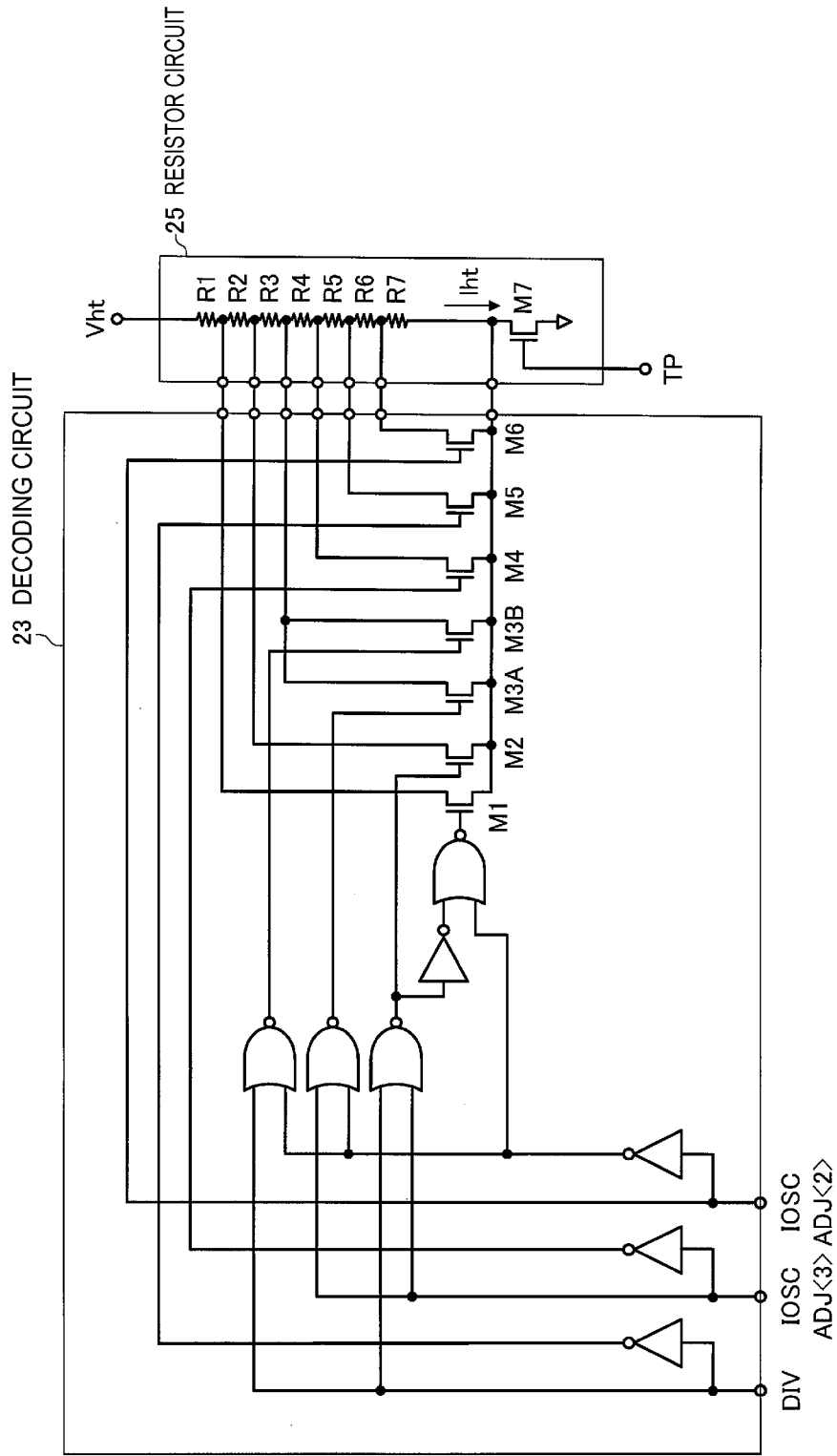
FIG. 14 is a view illustrating a configuration example of a decoding circuit and a resistor circuit in the oscillator according to the third embodiment.

FIG. 14 illustrates a configuration example of the decoding circuit 23 and a resistor circuit 25 illustrated in FIG. 12. In addition, FIG. 15 illustrates a truth table of the decoding circuit 23 illustrated in FIG. 14. As illustrated in FIGS. 14 and 15, in the third embodiment, by combining the high-order 2 bits of the oscillation step current adjustment register IOSC_ADJ and the 1 bit of the frequency dividing switching register DIV, the resistance value of the resistor circuit 25 is selected. Then, when the TP terminal is at a high level, an NMOS transistor M7 of the resistor circuit 25 is in an ON state, and the current Iht determined by the output voltage Vg of the differential amplifier AMP of the replica circuit 22 and the resistance value of the resistor circuit 25 flows to the heat generation circuit 21. In other words, in the embodiment, when the TP terminal is at a high level, the current Iht which flows to the heat generation circuit 21 is controlled by the high-order 2 bits of the oscillation step current adjustment register IOSC_ADJ, the 1 bit of the frequency dividing switching register DIV, and the 2 bits of the output level adjustment register VOUT_ADJ.

Since another configuration of the amplitude control circuit 20 in the third embodiment is similar to that of the amplitude control circuit 20 in the second embodiment, the description thereof will be omitted. In addition, since the entire configuration of the oscillator 1, the configuration of the circuit other than the amplitude control circuit 20, and the manufacturing method of the oscillator 1 of the third embodiment are similar to those in the oscillator 1 of the second embodiment, the drawings and the descriptions thereof will be omitted.

Figure 16:
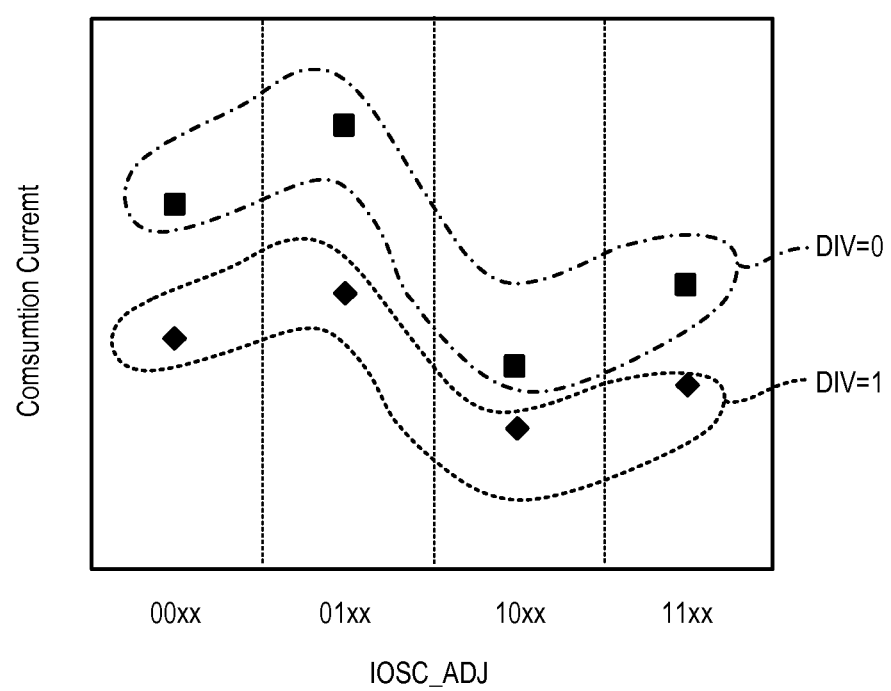
FIG. 16 is a view illustrating a state where the consumption current of the oscillator changes according to the set value of the oscillation step current adjustment register and a set value of a frequency dividing switching register.
Figure 17:
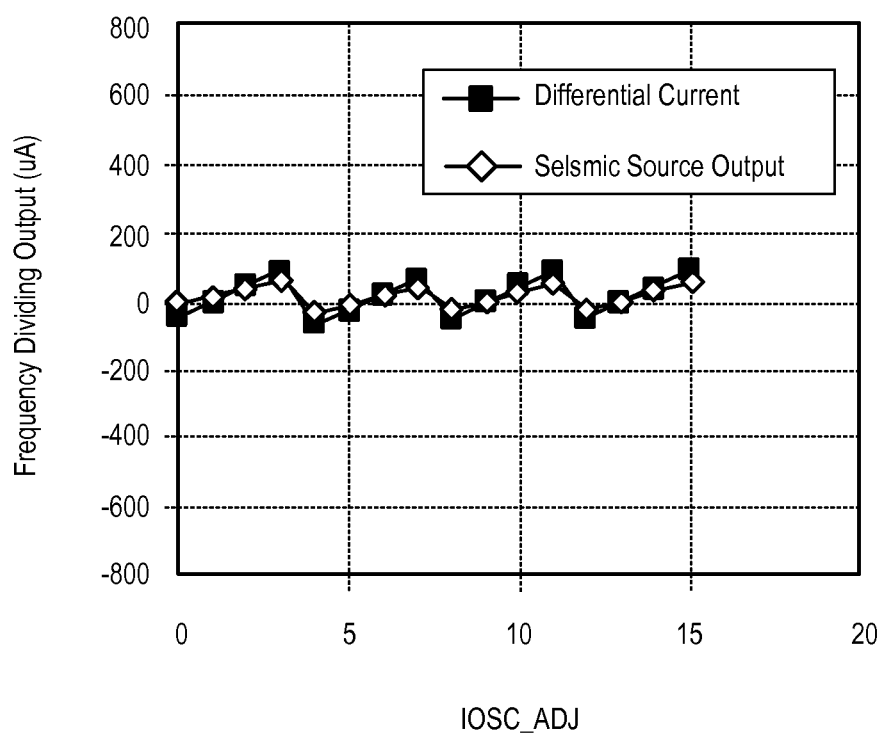
FIG. 17 is a view illustrating a relationship between a differential current and a frequency compensation error in the oscillator according to the third embodiment and in the oscillator in the related art.

FIG. 16 illustrates a state where the consumption current of the oscillator 1 changes according to the set value of the oscillation step current adjustment register IOSC_ADJ and the set value of the frequency dividing switching register DIV. In FIG. 16, in order to simplify the description, the set value of the output level adjustment register VOUT_ADJ is fixed. In addition, FIG. 17 illustrates one example of a relationship between the set value of the oscillation step current adjustment register IOSC_ADJ and the differential current. In FIG. 17, a relationship between when the set value of the frequency dividing switching register DIV is 0 (at a time of seismic source output) and when the set value of the frequency dividing switching register DIV is 1 (at a time of frequency dividing output) is illustrated. As illustrated in FIG. 17, in the oscillator 1 of the embodiment, since the low-order 2 bits of the IOSC_ADJ are not used in controlling the current Iht which flows to the heat generation circuit, the differential current slightly increases by the set value of the IOSC_ADJ. Even in this case, it is possible to suppress the differential current to approximately ±100 μA, and to suppress the frequency temperature compensation error to approximately 20 ppb, for example. As illustrated in FIG. 9, since the differential current is approximately 500 μA to 800 μA and the frequency temperature compensation error (DF/F) is approximately 100 ppb to 200 ppb in the oscillator in the related art, the oscillator 1 of the third embodiment can obtain more excellent characteristics than in the related art. According to the oscillator 1 of the third embodiment, it is possible to simplify the configuration of the heat generation circuit 21 by cutting down the bit number of the oscillation step current adjustment register, and to reduce the size of the circuit.

1-4. Fourth Embodiment

In the oscillator 1 of the third embodiment, when the output frequency is high (when the high-order bit of the VOUT_ADJ is set to be 1), the PMOS transistor M5 of the level correction circuit 24 is always OFF. However, reversely, when the output frequency is low (when the high-order bit of the VOUT_ADJ is set to be 0), the PMOS transistor M5 is always ON, and operates so that the current Irep which flows to the NMOS transistor of the replica circuit 22 is reduced. When normally operating (when the TP terminal is at a low level), the circumstance is excellent, but when adjusting the temperature compensated circuit 40 (when the TP terminal is at a high level), there is a case where the circumstance is a little bit bad. Specifically, when the output frequency is low (when the high-order bit of the VOUT_ADJ is set to be 0), the output voltage Vg of the differential amplifier AMP deteriorates as the current Irep of the replica circuit 22 decreases. Accordingly, the gate voltage Vg and the source voltage Vht of the NMOS transistor M3 of the heat generation circuit 21 deteriorates. As a result, in order to prevent the deterioration of the current Iht of the heat generation circuit 21, the resistance values of the resistors R1 to R7 of the resistor circuit 25 should be sufficiently small. However, in order to keep ratio accuracy of the current Iht which flows to the resistor circuit 25 illustrated in FIG. 14, ON resistance of the NMOS transistors M1 to M7 should be sufficiently low and leads to a size-up of the NMOS transistors M1 to M7.

Figure 18:
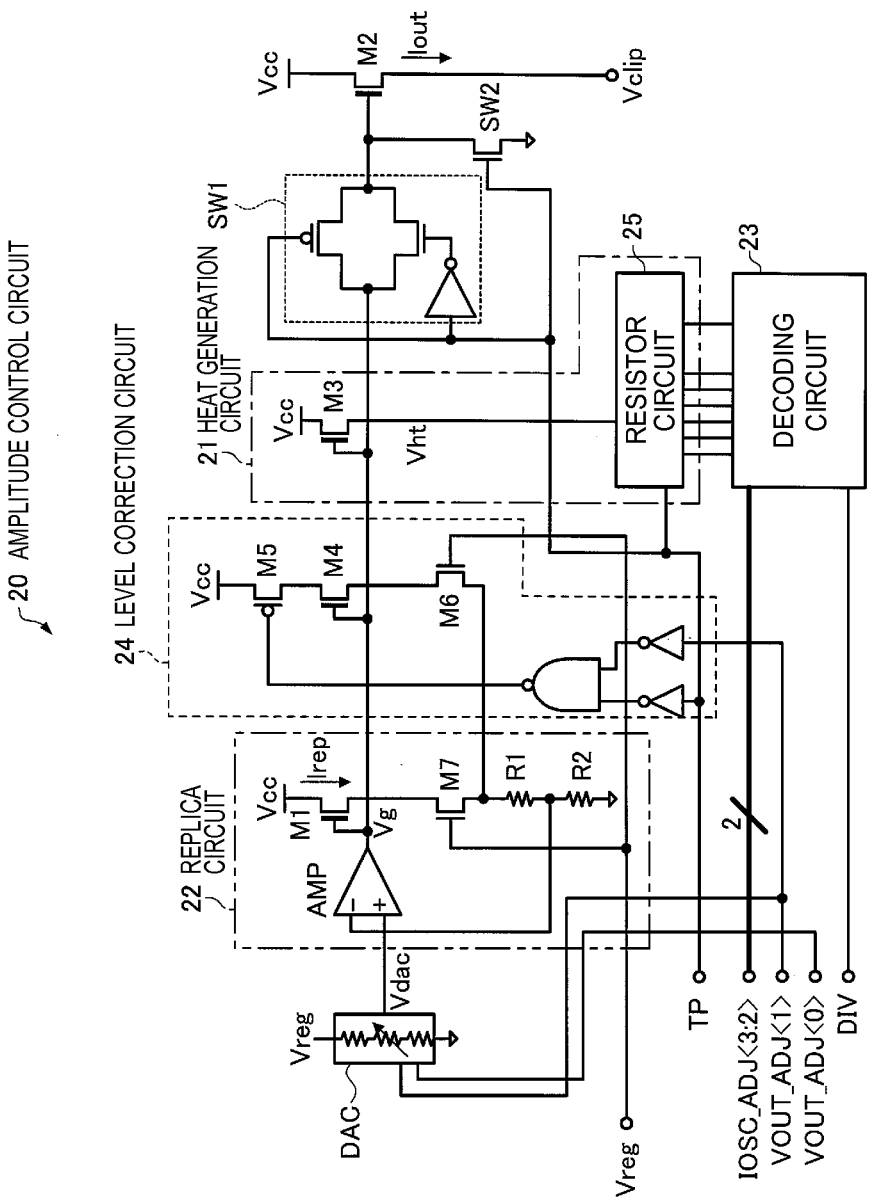
FIG. 18 is a view illustrating a configuration example of an amplitude control circuit in an oscillator according to a fourth embodiment.

Here, in the oscillator 1 of the fourth embodiment, not only when the output frequency is high (when the high-order of the VOUT_ADJ is set to be 1), but also when adjusting the temperature compensated circuit 40 (when the TP terminal is at a high level), the PMOS transistor M5 of the level correction circuit 24 is in an OFF state. FIG. 18 is a view illustrating a configuration example of the amplitude control circuit 20 in the oscillator 1 according to the fourth embodiment. As illustrated in FIG. 18, when the high-order bit of the VOUT_ADJ is 1, or when the TP terminal is at a high level, the PMOS transistor M5 of the level correction circuit 24 is in an OFF state. In other cases, the PMOS transistor M5 of the level correction circuit 24 is in an ON state.

Since another configuration of the amplitude control circuit 20 in the fourth embodiment is similar to that of the amplitude control circuit 20 in the third embodiment, the description thereof will be omitted. In addition, since the entire configuration of the oscillator 1, the configuration of the circuit other than the amplitude control circuit 20, and the manufacturing method of the oscillator 1 of the fourth embodiment are also similar to those in the oscillator 1 of the third embodiment, the drawings and the descriptions thereof will be omitted.

According to the oscillator 1 of the fourth embodiment, when adjusting the temperature compensated circuit 40 (when the TP terminal is at a high level), since the current Irep of the replica circuit 22 is not reduced, the output voltage Vg of the differential amplifier AMP does not deteriorate, and the gate voltage Vg and the source voltage Vht of the NMOS transistor M3 of the heat generation circuit 21 also do not deteriorate. As a result, without further reducing the resistance value of the resistors R1 to R7 of the resistor circuit 25 or an ON resistance of the NMOS transistors M1 to M7, while keeping the ratio accuracy of the current Iht which flows to the resistor circuit 25, it is possible to cause the current Iht to sufficiently flow to the heat generation circuit 21. Therefore, it is possible to avoid the size-up of the NMOS transistors M1 to M7.

In addition, in the oscillator 1 of the fourth embodiment, when the output frequency is low (when the high-order bit of the VOUT_ADJ is set to be 0), and when adjusting the temperature compensated circuit 40 (when the TP terminal is at a high level), compared to the oscillator 1 of the third embodiment, the current Irep which flows to the replica circuit 22 increases, and the ratio between the Irep and the Iout is deviated. However, since the current which is consumed by the output circuit 30 when normally operating in a case where the output frequency is low, an increase in the differential current can be relatively small. Therefore, even when the ratio between the Irep and the Iout is deviated when the output frequency is low, the increase in frequency temperature compensation error is suppressed, and as a result, the frequency temperature compensation is possible with excellent accuracy.

1-5. Fifth Embodiment

Figure 19:
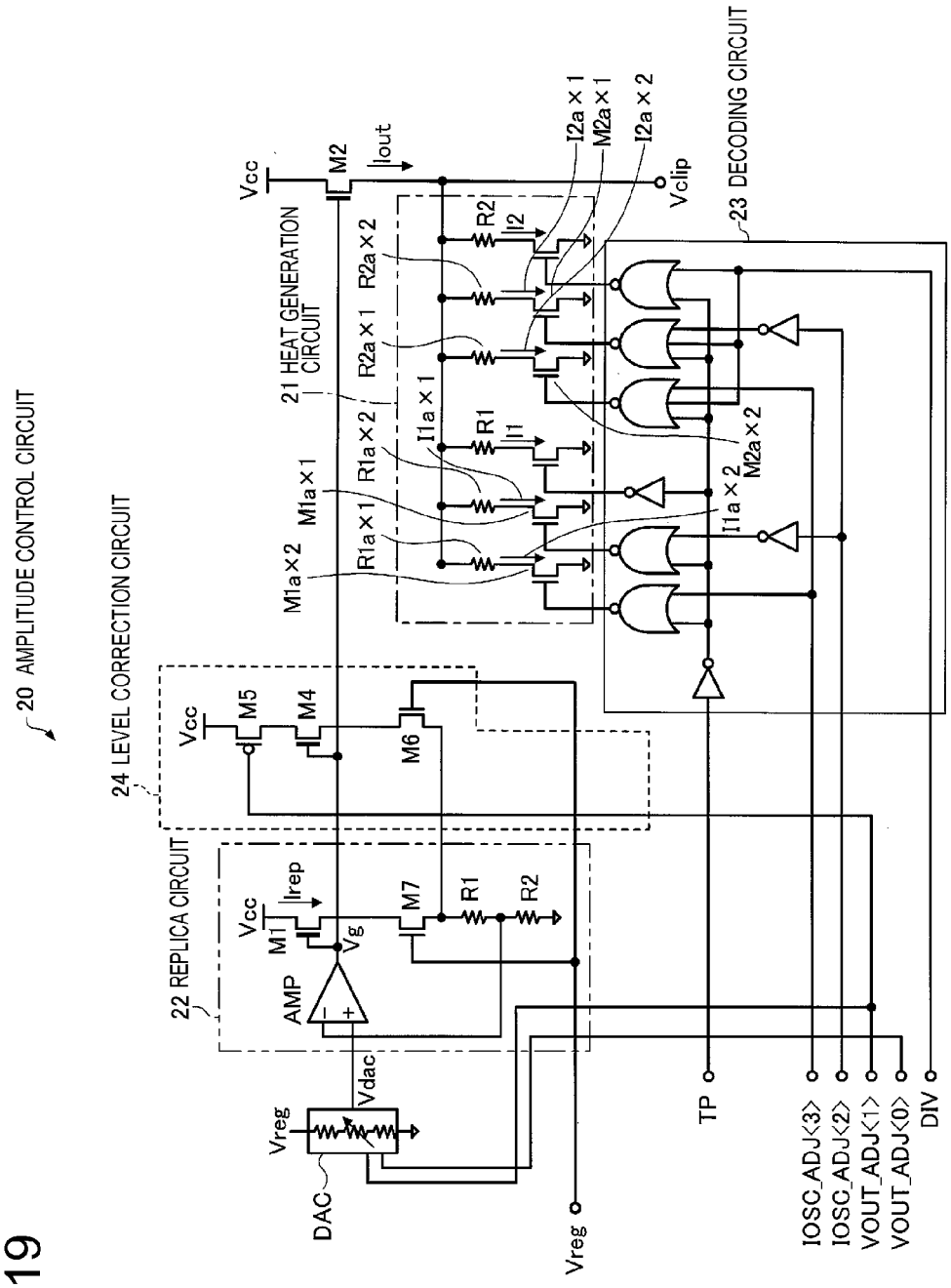
FIG. 19 is a view illustrating a configuration example of an amplitude control circuit in an oscillator according to a fifth embodiment.

FIG. 19 is a view illustrating a configuration example of the amplitude control circuit 20 in the oscillator 1 according to a fifth embodiment. As illustrated in FIG. 19, similarly to the third embodiment, in the decoding circuit 23, the amplitude control circuit 20 in the fifth embodiment has a configuration in which a similar relation to a case where the consumption current of the oscillator 1 is close to the central value when the memory 60 illustrated in FIG. 11 is in an initial state, in particular, when the set value of the IOSC_ADJ is an initial state, is kept, and a current setting of the heat generation circuit 21 according to the set value of the IOSC_ADJ, is decoded. Then, when adjusting the temperature compensated circuit 40 (when the TP terminal is set to be at a high level), the heat generation circuit 21 is in an operation state, and by combining the high-order 2 bits of the oscillation step current adjustment register IOSC_ADJ and the 1 bit of the frequency dividing switching register DIV, the resistance value of the heat generation circuit 21 is selected. Furthermore, when the frequency dividing switching register DIV is set to be 1, a parallel resistor group which is made of the resistors R2 and R2a is in a non-selecting state, and can be selected so that the current flows to the parallel resistor group which is made of the resistors R1 and R1a. In addition, the resistor R1 is in an ON state regardless of the set value of the IOSC_ADJ, and performs determination of an offset current amount of the heat generation circuit 21. When the frequency dividing switching register DIV is set to be 0, a parallel resistor group which is made of the resistors R2 and R2a is also in a selectable state, and the current of the heat generation circuit 21 increases.

A constant ratio between the resistor R1a and an NMOS transistor M1a and between the resistor R2a and an NMOS transistor M2a is kept so that the current of the heat generation circuit 21 is changed according to a change of the high-order 2 bits of the oscillation step current adjustment register IOSC_ADJ, and the current which flows to the heat generation circuit 21 is controlled by the set value of the IOSC_ADJ.

Since another configuration of the amplitude control circuit 20 in the fifth embodiment is similar to that of the amplitude control circuit 20 in the third embodiment, the description thereof will be omitted. In addition, since the entire configuration of the oscillator 1, the configuration of the circuit other than the amplitude control circuit 20, and the manufacturing method of the oscillator 1 of the fifth embodiment are also similar to those in the oscillator 1 of the third embodiment, the drawings and the descriptions thereof will be omitted.

Figure 20:
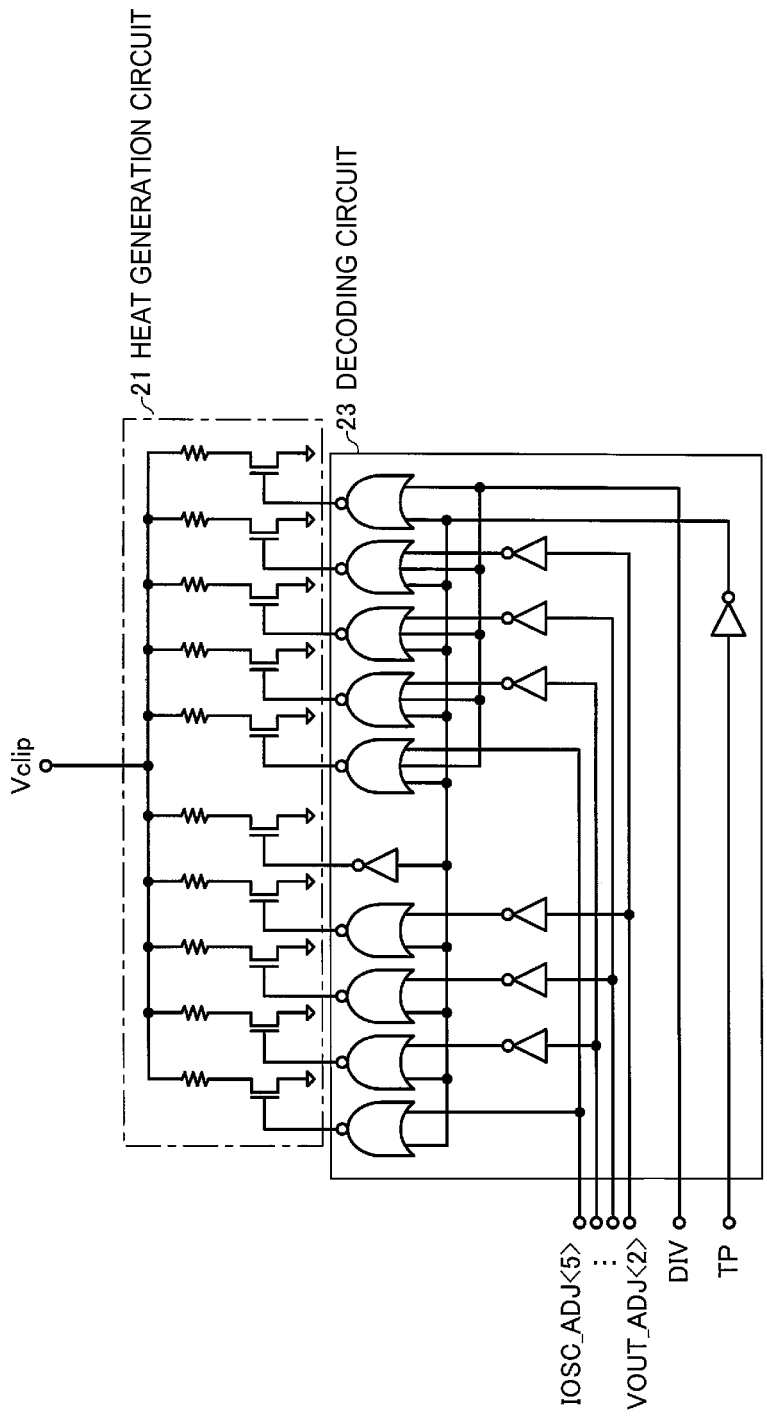
FIG. 20 is a view illustrating a configuration example of a heat generation circuit and the decoding circuit when the oscillation step current adjustment register expands to 6 bits.

In the oscillator 1 of the third embodiment, since the resistors of the resistor circuit 25 are connected to each other in series, when the oscillation step current adjustment register IOSC_ADJ increases by n bits, the number of the circuit elements of the decoding circuit 23 increases by approximately 2 n times. However, according to the oscillator 1 of the fifth embodiment, since the resistors of the heat generation circuit 21 are connected to each other in parallel, even when the bit number of the oscillation step current adjustment register IOSC_ADJ increases, it is possible to suppress the scale of the decoding circuit 23. As an example, FIG. 20 illustrates a configuration example of the heat generation circuit 21 and the decoding circuit 23 when the oscillation step current adjustment register IOSC_ADJ expands to 6 bits.

1-6. Sixth Embodiment

In the TCXO which is used in a network-related device or a small-sized wireless base station, a CMOS output type is generally used. For example, an LV-CMOS output or the like which swings between Vcc=0 V to 3.3 V is representative. Here, the oscillator 1 of the sixth embodiment includes the output circuit 30 as a CMOS output circuit.

Figure 21:
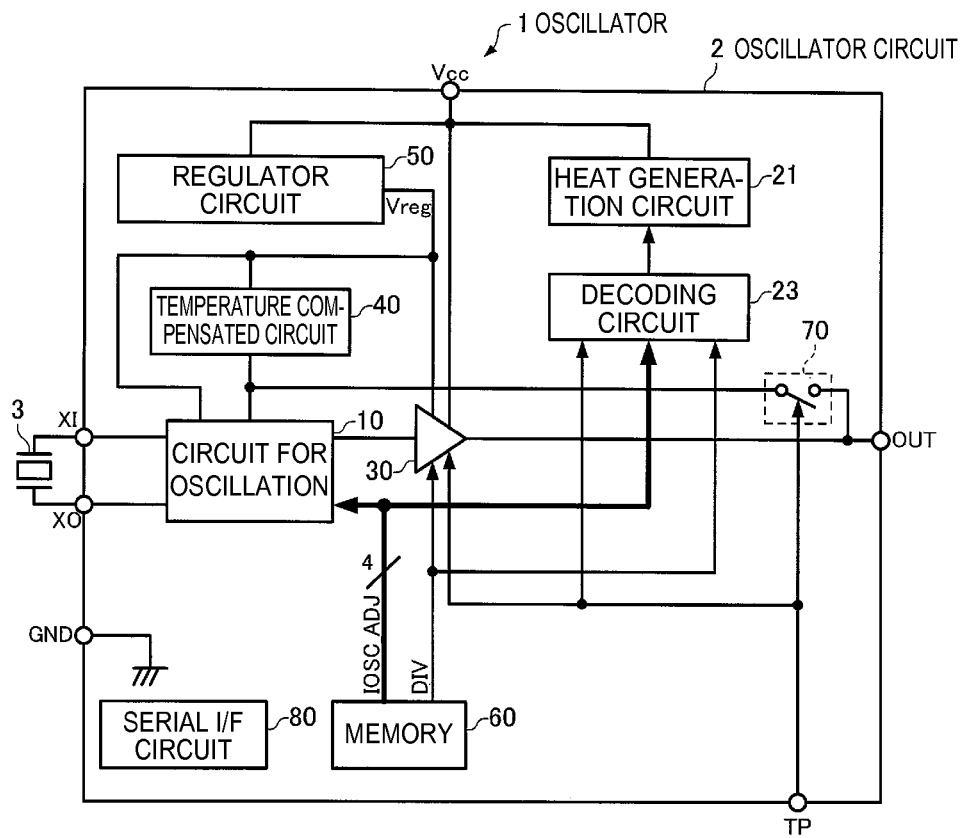
FIG. 21 is a configuration view of an oscillator according to a sixth embodiment.

FIG. 21 is a configuration view of the oscillator 1 according to a sixth embodiment. After selecting an oscillation signal from the circuit for oscillation 10 or the oscillation signal, the output circuit 30 outputs a CMOS output wave form which swings between the power supply and the GND. In addition, when adjusting the temperature compensated circuit 40, the heat generation circuit 21 consumes the current by matching the current which is consumed by the output circuit 30, and a change in the heat generation amount is suppressed.

Figure 22:
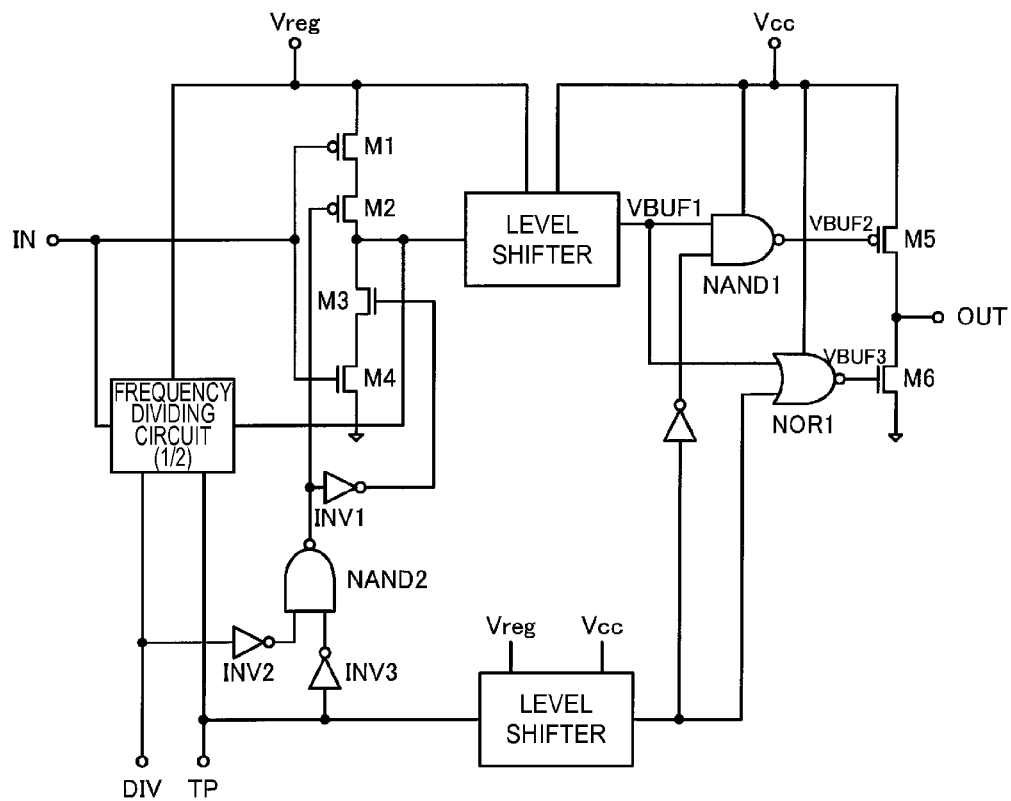
FIG. 22 is a view illustrating a configuration example of an output circuit in the oscillator according to the sixth embodiment.

FIG. 22 is a view illustrating a configuration example of the output circuit 30 in the oscillator 1 according to the sixth embodiment. The output voltage Vreg of the regulator circuit 50 is applied to the Vreg terminal, and an outer power supply voltage Vcc is applied to the Vcc terminal.

The output circuit 30 is provided with the inverter which is made of the frequency dividing circuit which is operated at constant voltage Vreg and the MOS transistors M1 to M4, and is configured to be selectable whether or not the signal (the oscillation signal output by the circuit for oscillation 10) input into the IN terminal is divided into two by a voltage level of the DIV terminal. In the embodiment, when the set value of the frequency dividing switching register DIV is 0, the DIV terminal is set to be at a low level, the input signal is not divided and is transferred to a NAND circuit NAND 1 and a NOR circuit NOR1 in which a high level is converted into the power supply voltage Vcc by a level shifter after a polarity is inverted by the inverter which is made of the MOS transistors M1 to M4. Meanwhile, when the set value of the frequency dividing switching register DIV is 1, the DIV terminal is set to be at a high level, the input signal is transferred to the NAND circuit NAND 1 and the NOR circuit NOR1 in which a high level is converted into the power supply voltage Vcc by the level shifter after the input signal is divided into ½ by the frequency dividing circuit.

In addition, the output circuit 30 is in an operable state when the TP terminal is at a low level, and in an operation stop state when the TP terminal is at a high level. When normally operating, the TP terminal is set to be at a low level, the input signal from the input terminal IN is converted into a signal of the CMOS output wave form by the level shifter and is output from the OUT terminal. When adjusting the temperature compensated circuit 40, the TP terminal is set to be at a high level, the MOS transistors M2 and M3 are OFF, the output node VBUF2 of the NAND circuit NAND1 is a power supply potential, and the output node VBUF3 of the NOR circuit NOR1 is a grounding potential, and the PMOS transistor M5 and the NMOS transistor M6 are in an OFF state. Accordingly, the output circuit 30 is in an operation stop state.

Figure 23:
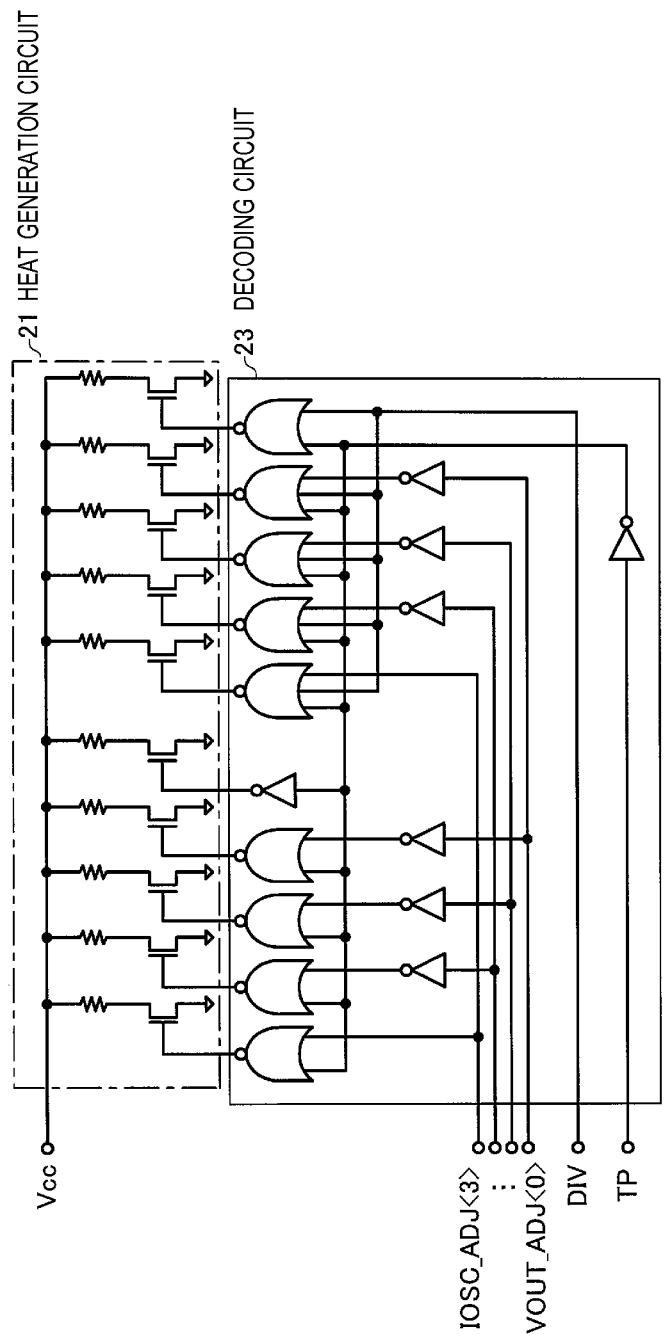
FIG. 23 is a view illustrating a configuration example of a heat generation circuit and a decoding circuit in the oscillator according to the sixth embodiment.

FIG. 23 is a view illustrating a configuration example of the heat generation circuit 21 and the decoding circuit 23 in the oscillator 1 according to the sixth embodiment. Since the output circuit 30 in the embodiment performs the CMOS output, the consumption current is approximately several mA which is relatively high. For this reason, since the current of the heat generation circuit 21 is required to be controlled finely, all of 4 bits of the oscillation step current adjustment register IOSC_ADJ is fully utilized. In other words, the decoding circuit 23 decodes 5 bits by combining 4 bits of the oscillation step current adjustment register IOSC_ADJ and 1 bit of the frequency dividing switching register DIV, and the heat generation circuit 21 is controlled.

Since another configuration of the oscillator 1 in the sixth embodiment is similar to the oscillator 1 in the first embodiment, the description thereof will be omitted. In addition, since the manufacturing method of the oscillator 1 of the sixth embodiment is also similar to that of the oscillator 1 of the first embodiment, the drawings and the description thereof will be omitted.

2. Electronic Device

Figure 24:
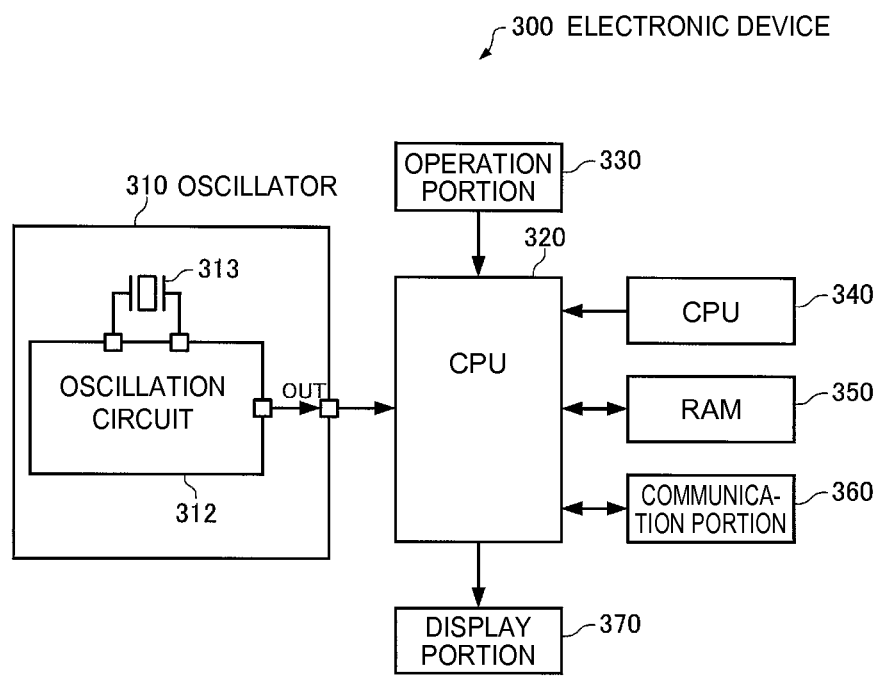
FIG. 24 is a functional block diagram of an electronic device according to the embodiment.
Figure 25:
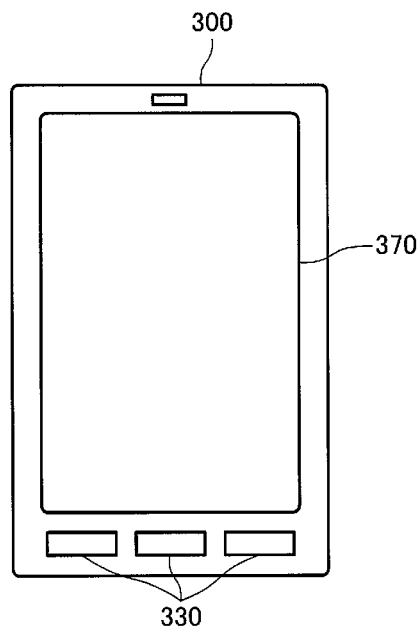
FIG. 25 is a view illustrating an example of the outer appearance of the electronic device according to the embodiment.

FIG. 24 is a functional block diagram of an electronic device according to the embodiment. In addition, FIG. 25 is a view illustrating an example of an outer appearance of a smart phone which is an example of the electronic device according to the embodiment.

An electronic device 300 of the embodiment includes an oscillator 310, a central processing unit (CPU) 320, an operation portion 330, a read only memory (ROM) 340, a random access memory (RAM) 350, a communication portion 360, and a display portion 370. In addition, the electronic device in the embodiment may omit or change apart of constituent elements (each portion) in FIG. 24, or may add another constituent element.

The oscillator 310 is provided with an oscillation circuit 312 and a resonator 313. The oscillation circuit 312 oscillates the resonator 313 and generates the oscillation signal. The oscillation signal is output to the CPU 320 from the OUT terminal of the oscillator 310.

The CPU 320 performs various calculation process or control process by using the oscillation signal input from the oscillator 310 as the clock signal, according to a program which is stored in the ROM 340 or the like. Specifically, the CPU 320 performs various processes according to the operation signal from the operation portion 330, a process of controlling the communication portion 360 for performing data communication with an external device, or a process of sending a display signal for displaying various types of information on the display portion 370.

The operation portion 330 is an input device which is configured of an operation key or a button switch, and outputs an operation signal according to the operation by a user to the CPU 320.

The ROM 340 stores a program or data for performing various types of calculation process or control process by the CPU 320.

The RAM 350 is used as an operation area of the CPU 320, and temporarily stores a program or data read out from the ROM 340, data input from the operation portion 330, and a result of an arithmetic operation which is performed according to a program by the CPU 320.

The communication portion 360 performs various controls for making the data communication between the CPU 320 and the external device valid.

The display portion 370 is a display device which is configured of a liquid crystal display (LCD) or the like, and displays various types of information based on the display signal input from the CPU 320. A touch panel which functions as the operation portion 330 may be provided in the display portion 370.

It is possible to realize an electronic device having high reliability by employing the oscillator circuit 2 of each of the above-described embodiments as the oscillation circuit 312, or by employing the oscillator 1 of each of the above-described embodiments as the oscillator 310.

Various types of electronic device can be considered as the electronic device 300, and examples of the electronic device include a moving object terminal, such as a personal computer (for example, a mobile type personal computer, a lap top type personal computer, a tablet type personal computer), smart phone, or a mobile phone, a digital still camera, an ink jet type discharging apparatus (for example, an ink jet printer), a storage area network device, such as a router or a switch, a local area network device, a moving object terminal base station device, a television, a video camera, a video recorder, a car navigation device, a real time clock device, a pager, an electronic organizer (including an electronic organizer having a communication function), an electronic dictionary, a calculator, an electronic game machine, a game controller, a word processor, a work station, a television phone, a television monitor for security, electronic binoculars, a POS terminal, a medical device (for example, an electronic thermometer, a sphygmomanometer, a blood sugar level meter, an electrocardiographic apparatus, an ultrasonic diagnostic equipment, and an electronic endoscope), a fish finder, various types of measuring device, meters (for example, meters for a vehicle, an aircraft, and a vessel), a flight simulator, a head-mounted display, a motion trace, a motion tracking, a motion controller, or a pedestrian dead-reckoning (PDR).

3. Moving Object

Figure 26:
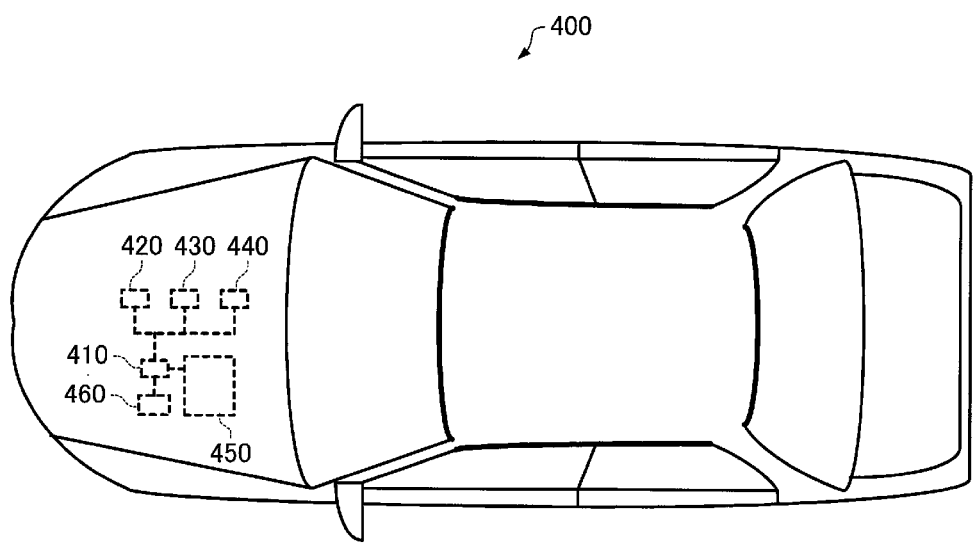
FIG. 26 is a view illustrating an example of a moving object according to the embodiment.

FIG. 26 is a view (upper view) illustrating an example of a moving object according to the embodiment. A moving object 400 illustrated in FIG. 26 includes an oscillator 410, controllers 420, 430, and 440 which perform various types of controls, such as an engine system, a break system, or a keyless entry system, a battery 450, and a power-up battery 460. In addition, the moving object of the embodiment may omit a part of constituent elements (each portion) in FIG. 26, or may add another constituent element.

The oscillator 410 is provided with an oscillation circuit and a resonator which are not illustrated in the drawing. The oscillation circuit oscillates the resonator and generates the oscillation signal. The oscillation signal is output to controllers 420, 430, and 440 from the outer terminal of the oscillator 410, and for example, is used as a clock signal.

The battery 450 supplies electric power to the oscillator 410 and the controllers 420, 430, and 440. The power-up battery 460 supplies electric power to the oscillator 410 and the controllers 420, 430, and 440 when the output voltage of the battery 450 is lower than a threshold value.

As the oscillation circuit which is provided in the oscillator 410, for example, the oscillator circuit 2 of each of the above-described embodiments is employed, or as the oscillator 410, for example, the oscillator 1 of each of the above-described embodiments is employed. According to this, it is possible to realize a moving object having high reliability.

Various types of moving objects can be considered as the moving object 400, and examples of the moving object include a vehicle (including an electric vehicle), an aircraft, such as a jet plane or a helicopter, a vessel, a rocket, or an artificial satellite.

The invention is not limited to the embodiment, and various modification embodiments are possible within the scope of the idea of the invention.

For example, in the above-described embodiment, as the property adjustment circuit, the oscillator (TCXO) having the temperature compensated circuit is exemplified. However, in addition to this, the invention can employ various oscillators, such as an oscillator (SPXO or the like) having a frequency adjustment circuit as the property adjustment circuit or an oscillator (VCXO or VC-TCXO) having an auto frequency control (AFC) circuit as the property adjustment circuit.

The above-described embodiments and the modification example are examples, and the invention is not limited thereto. For example, it is possible to appropriately combine each embodiment and each modification example.

The invention includes substantially the same configuration (for example, a configuration which has the same functions, methods, and results, or a configuration which has the same objective and effects) as the configuration described in the embodiments. In addition, the invention includes a configuration in which parts that are not essential in the configuration described in the embodiments are replaced. In addition, the invention includes a configuration in which the same operation effects as in the configuration described in the embodiments are achieved, or a configuration in which the same objective as in the configuration described in the embodiments is achieved. In addition, the invention includes a configuration in which a known technology is added to the configuration described in the embodiments.

The entire disclosure of Japanese Patent Application No. 2013-267812, filed Dec. 25, 2013 is expressly incorporated by reference herein.

What is claimed is:

1. An oscillation circuit, comprising:
a circuit for oscillation;
a property adjustment circuit;
an output circuit into which a signal output from the circuit for oscillation is input and that outputs an oscillation signal;
an amplitude control circuit including an amplitude control portion that controls amplitude of the oscillation signal and a heat generation portion into which a DC current is input and that generates heat;
a first terminal that is electrically connected to an output side of the output circuit; and
a switching portion that switches the electric connection between the property adjustment circuit and the first terminal, wherein:
in the heat generation portion, based on operation states of the circuit for oscillation and the amplitude control portion, the DC current is controlled and a heat generation amount is controlled,
in a first mode, the switching portion is controlled so that the property adjustment circuit and the first terminal are not electrically connected to each other, the oscillation signal output from the output circuit is output to the first terminal, and the DC current which is input into the heat generation portion is stopped, and
in a second mode, the switching portion is controlled so that the property adjustment circuit and the first terminal are electrically connected to each other, the oscillation signal stops being output from the output circuit, and the heat generation portion controls the DC current based on the operation states of the circuit for oscillation and the amplitude control portion.

2. The oscillation circuit according to claim 1, wherein the amplitude control circuit includes a level correction circuit for controlling a size of a signal which controls amplitude of the oscillation signal based on the operation state of the amplitude control portion.

3. The oscillation circuit according to claim 1, further comprising:
a memory which stores data for controlling the circuit for oscillation and data for controlling the amplitude control circuit.

4. The oscillation circuit according to claim 1, wherein the property adjustment circuit is a temperature compensated circuit.

5. The oscillation circuit according to claim 2, wherein the property adjustment circuit is a temperature compensated circuit.

6. The oscillation circuit according to claim 3, wherein the property adjustment circuit is a temperature compensated circuit.

7. The oscillation circuit according to claim 1, wherein the output circuit includes a frequency dividing circuit.

8. An oscillator, comprising:
the oscillation circuit according to claim 1; and
a resonator.

9. An oscillator, comprising:
the oscillation circuit according to claim 2; and
a resonator.

10. An oscillator, comprising:
the oscillation circuit according to claim 3; and
a resonator.

11. An oscillator, comprising:
the oscillation circuit according to claim 4; and
a resonator.

12. An electronic device, comprising:
the oscillation circuit according to claim 1.

13. A moving object, comprising:
the oscillation circuit according to claim 1.

14. A manufacturing method of an oscillator, comprising:
electrically connecting an oscillation circuit including a circuit for oscillation, a property adjustment circuit, an output circuit into which a signal output from the circuit for oscillation is input and which outputs an oscillation signal, an amplitude control circuit including an amplitude control portion which controls amplitude of the oscillation signal and a heat generation portion into which a DC current is input and controlled and which controls a heat generation amount, based on operation states of the circuit for oscillation and the amplitude control portion, a first terminal which is electrically connected to an output side of the output circuit, and a switching portion which switches the electrical connection between the property adjustment circuit and the first terminal, and a resonator;

switching the switching portion so that the property adjustment circuit and the first terminal are electrically connected to each other, stopping the output of the oscillation signal from the output circuit, and inputting the DC current based on operations of the circuit for oscillation and the amplitude control portion to the heat generation portion;

adjusting the property adjustment circuit; and switching the switching portion so that the property adjustment circuit and the first terminal are not electrically connected to each other, outputting the oscillation signal from the output circuit, and causing the DC current not to flow to the heat generation portion.

* * * * *